United States Patent
Oh et al.

(10) Patent No.: US 12,439,794 B2
(45) Date of Patent: Oct. 7, 2025

(54) DISPLAY PANEL HAVING EACH ACTIVE AREA GATE-IN-PANEL (AAGIP) UNIT DISPOSED BETWEEN ADJACENT ONES OF THE PLURALITY OF PIXEL BLOCKS AND DISPLAY DEVICE INCLUDING THE SAME

(71) Applicant: LG Display Co., Ltd., Seoul (KR)

(72) Inventors: Daeseok Oh, Paju-si (KR); Sunghun Kim, Iksan-si (KR); Taehun Kim, Seoul (KR)

(73) Assignee: LG Displays Co., Ltd., Seoul (KR)

( * ) Notice: Subject to any disclaimer, the term of this patent is extended or adjusted under 35 U.S.C. 154(b) by 542 days.

(21) Appl. No.: 17/893,890

(22) Filed: Aug. 23, 2022

(65) Prior Publication Data

US 2023/0061191 A1 Mar. 2, 2023

(30) Foreign Application Priority Data

Sep. 1, 2021 (KR) .................. 10-2021-0116274

(51) Int. Cl.
*H01L 29/08* (2006.01)
*G09G 3/3291* (2016.01)
(Continued)

(52) U.S. Cl.
CPC ......... *H10K 59/353* (2023.02); *G09G 3/3291* (2013.01); *H10K 59/131* (2023.02);
(Continued)

(58) Field of Classification Search
CPC ......... G09G 3/3291; G09G 2300/0452; G09G 2300/0842; G09G 2310/0272; G09G 2310/0278; G09G 2320/0223
(Continued)

(56) References Cited

U.S. PATENT DOCUMENTS 9,837,028 B2 12/2017 Liu
10,176,775 B2 1/2019 Lee et al.
(Continued)

FOREIGN PATENT DOCUMENTS

CN 103208248 A * 7/2013 .......... G02F 1/1343
CN 104240668 A 12/2014
(Continued)

OTHER PUBLICATIONS

Cite the machine translation Zhang S (CN-103208248-A).*
(Continued)

*Primary Examiner* — Phuc T Dang
(74) *Attorney, Agent, or Firm* — Seed Intellectual Property Law Group LLP

(57) ABSTRACT

Disclosed are a display panel having a large area, high resolution, a narrow bezel, low power consumption, and having reduced Resistance Capacitance (RC) delay, and a display device including the same. The display panel includes an Active Area Gate-In-Panel (AAGIP) disposed between adjacent pixel blocks, wherein the AAGIP unit is configured to: connect an n scan line disposed in and along sub-pixels of an n-th row of the pixel block on one side of the AAGIP unit and an n scan line disposed in and along sub-pixels of an (n+1)-th row of the pixel block on the other side thereof to each other; and connect an n+1 scan line disposed in and along sub-pixels of an (n+1)-th row of the pixel block on one side thereof and an n+1 scan line disposed in and along sub-pixels of an n-th row of the pixel block on the other side thereof to each other. Thus, defect such as crosstalk or smear caused by data line transition is reduced.

15 Claims, 14 Drawing Sheets

(51) Int. Cl.
*H10K 59/131* (2023.01)
*H10K 59/35* (2023.01)

(52) U.S. Cl.
CPC .............. *G09G 2300/0452* (2013.01); *G09G 2300/0842* (2013.01); *G09G 2310/0272* (2013.01); *G09G 2310/0278* (2013.01); *G09G 2320/0223* (2013.01)

(58) Field of Classification Search
USPC .......................................................... 257/40
See application file for complete search history.

(56) References Cited

U.S. PATENT DOCUMENTS

| | | | |
|---|---|---|---|
| 11,308,872 | B2 | 4/2022 | Kim et al. |
| 11,600,685 | B2 | 3/2023 | Kim et al. |
| 2014/0152629 | A1 | 6/2014 | So et al. |
| 2017/0301283 | A1* | 10/2017 | Liu ........................... G09G 3/32 |
| 2017/0345373 | A1 | 11/2017 | Kang et al. |
| 2018/0068629 | A1 | 3/2018 | Shin et al. |
| 2021/0043149 | A1 | 2/2021 | Yoo et al. |
| 2021/0118370 | A1 | 4/2021 | Shim et al. |
| 2021/0118386 | A1* | 4/2021 | No ....................... G09G 3/3648 |
| 2021/0201821 | A1 | 7/2021 | Baek |
| 2021/0202677 | A1 | 7/2021 | Kim et al. |

FOREIGN PATENT DOCUMENTS

| | | | | |
|---|---|---|---|---|
| CN | 105957492 | A * | 9/2016 | ........... G09G 3/3607 |
| CN | 106782416 | A | 5/2017 | |
| CN | 106932936 | A | 7/2017 | |
| CN | 109841193 | A | 6/2019 | |
| CN | 112530361 | A * | 3/2021 | |
| CN | 113129835 | A | 7/2021 | |
| KR | 20190036447 | A | 4/2019 | |
| KR | 20190036461 | A | 4/2019 | |
| KR | 20200036415 | A | 4/2020 | |
| KR | 20210017876 | A | 2/2021 | |
| RU | 2669521 | C1 * | 10/2018 | ........... G09G 3/3208 |
| WO | WO 2021091570 | A1 | 5/2021 | |

OTHER PUBLICATIONS

Cite the machine translation Tian K (CN-105957492-A).*
Cite the machine translation Yan S (RU-2669521-C1).*
Cite the machine translation Kim Y (CN-112530361-A).*

* cited by examiner

DISPLAY PANEL HAVING EACH ACTIVE AREA GATE-IN-PANEL (AAGIP) UNIT DISPOSED BETWEEN ADJACENT ONES OF THE PLURALITY OF PIXEL BLOCKS AND DISPLAY DEVICE INCLUDING THE SAME

CROSS-REFERENCE TO RELATED APPLICATION

This application claims a benefit under 35 U.S.C. § 119(a) of Korean Patent Application No. 10-2021-0116274 filed on Sep. 1, 2021, in the Korean Intellectual Property Office, the entire disclosure of which is incorporated herein by reference for all purposes.

BACKGROUND

Technical Field

The present disclosure relates to a display panel having a large area, high resolution, a narrow bezel, low power consumption, and having reduced RC (Resistance Capacitance) delay, and a display device including the same.

Description of Related Art

A flat panel display device (FPD) includes an organic light-emitting diode (OLED) display device which has high luminance and low operating voltage.

The OLED display device is a self-luminous type device that emits light by itself. Thus, a contrast ratio thereof is high and the device may realize an ultra-thin display. The device has a response time of several microseconds, such that it is easy to realize a moving image. There is no restriction on a viewing angle. The device is stable even at low temperatures. The device operates at a low DC voltage of 5 to 15V. Thus, it is easy to manufacture and design an operation circuit thereof.

Each pixel area of the OLED display device includes a plurality of thin-film transistors, such as a switching thin-film transistor, a driving thin-film transistor, and a sensing thin-film transistor.

BRIEF SUMMARY

Under a trend that a size of a display panel of the OLED display device is larger and a design of the device becomes a more important factor, the device employs an Active Area Gate-In-Panel (AAGIP) scheme in which a gate driver circuit is disposed in in a display area (active area) AA and for each predefined pixel block.

The AAGIP scheme OLED display device applies the same GIP scan signal to the same horizontal line of the pixel blocks on a predefined pixel block basis. Further, a control share pixel to control a voltage signal application is used in the AAGIP scheme OLED display device.

The AAGIP disposed in the panel applies a scan signal to the same horizontal scan line. A crosstalk occurs because the scan line is greatly affected by a data line to which a data voltage signal is applied.

For example, ripple occurs due to data voltage signal fluctuation (data line transition) of the data line, and horizontal crosstalk occurs due to influence of non-black screen data (Non-Box Data) caused by the ripple. In this regard, a level of the crosstalk or smear varies based on a size of a black box that causes the ripple and a gray level of a data voltage pattern.

Accordingly, in order to solve the above-mentioned problems, the inventors of the present disclosure have invented a AAGIP scheme display panel in which a gate driver circuit is disposed in each predefined pixel block in a display area in an OLED display device to reduce defects such as the crosstalk or the smear caused by the data signal fluctuation of the data line.

Further, the inventors of the present disclosure have invented a display device in which an individual operation of a horizontal scan line on a pixel block basis in a display area may reduce or minimize influence of the same data signal such as a crosstalk pattern.

Technical benefits and advantages according to the present disclosure that are not mentioned may be understood based on following descriptions, and may be more clearly understood according to embodiments according to the present disclosure. Further, it will be easily understood that the benefits and advantages according to the present disclosure may be realized using means shown in the claims and combinations thereof.

A display panel according to a first embodiment of the present disclosure may be provided. The display panel includes: a plurality of pixel blocks, each including a plurality of sub-pixels arranged in rows and columns; and a plurality of AAGIP (Active Area Gate-In-Panel) units, each being disposed between adjacent ones of the plurality of pixel blocks, wherein an n scan line is disposed in and along sub-pixels of an n-th row in the pixel block on one side of one AAGIP unit, and an n+1 scan line is disposed in and along sub-pixels of an (n+1)-th row line of the pixel block on one side of the one AAGIP unit, wherein an n+1 scan line is disposed in and along sub-pixels of an n-th row in a pixel block on the other side of the one AAGIP unit, and an n scan line is disposed in and along sub-pixels of an (n+1)-th row line of the pixel block on the other side of the one AAGIP unit, wherein the one AAGIP unit is configured to: connect the n scan line disposed in and along the sub-pixels of the n-th row of the pixel block on one side of the one AAGIP unit to the n scan line disposed in and along the sub-pixels of the (n+1)-th row of the pixel block on the other side of the one AAGIP unit; and connect the n+1 scan line disposed in and along the sub-pixels of the (n+1)-th row of the pixel block on one side of the one AAGIP unit to the n+1 scan line disposed in and along the sub-pixels of the n-th row of the pixel block on the other side of the one AAGIP unit.

Further, a display panel according to a second embodiment of the present disclosure may be provided. The display panel includes: a plurality of pixel blocks, each including a plurality of sub-pixels arranged in rows and columns; and a plurality of AAGIP (Active Area Gate-In-Panel) units, each being disposed between adjacent ones of the plurality of pixel blocks, wherein an n scan line is disposed in and along sub-pixels of an n-th row in the pixel block on one side of one AAGIP unit, and an n+1 scan line is disposed in and along sub-pixels of an (n+1)-th row line of the pixel block on one side of the one AAGIP unit, wherein an n scan line is disposed in and along sub-pixels of an n-th row in a pixel block on the other side of the one AAGIP unit, and an n+1 scan line is disposed in and along sub-pixels of an (n+1)-th row line of the pixel block on the other side of the one AAGIP unit, wherein the one AAGIP unit is configured to: apply an N scan signal to the n scan line disposed in and along the sub-pixels of the n-th row of the pixel block on one side of the one AAGIP unit and to the n+1 scan line disposed in and along the sub-pixels of the (n+1)-th row of the pixel block on the other side of the one AAGIP unit to each other; and apply an N+1 scan signal to the n+1 scan line disposed in and along the sub-pixels of the (n+1)-th row of the pixel block on one side of the one AAGIP unit and to the n scan line disposed in and along the sub-pixels of the n-th row of the pixel block on the other side of the one AAGIP unit to each other.

Further, a display device according to one embodiment of the present disclosure may be provided. The display device includes a display panel according to the first embodiment as described above, a data driver for applying a data signal to the display panel, a power supply for providing various types of powers thereto, and a timing controller for controlling the plurality of AAGIP units and the data driver.

Further, a display device according to another embodiment of the present disclosure may be provided. The display device includes a display panel according to the second embodiment as described above, a data driver for applying a data signal to the display panel, a power supply for providing various types of powers thereto, and a timing controller for controlling the plurality of AAGIP units and the data driver.

According to an embodiment of the present disclosure, the display device may reduce a defect phenomenon such as the crosstalk or smear caused by the data signal variation (data line transition) of the data line.

Further, according to an embodiment of the present disclosure, the display device may significantly reduce a RC delay due to a large-area screen.

Further, according to an embodiment of the present disclosure, changing an operation timing used in a 2Scan 1EM scheme may allow drop in operation power (VDD IR Drop) to be compensated for.

Further, according to an embodiment of the present disclosure, the display device may secure a sampling time of 8H or greater without an increase in a signal line in the 2Scan 1EM scheme.

Further, according to an embodiment of the present disclosure, an individual operation of a horizontal scan line on a pixel block basis may reduce or minimize the influence of the same data signal such as the crosstalk pattern.

Moreover, according to an embodiment of the present disclosure, the display panel with a large area, high resolution, a narrow bezel, and low power consumption and the display device including the same may be realized.

Effects of the present disclosure are not limited to the above-mentioned effects, and other effects as not mentioned will be clearly understood by those skilled in the art from following descriptions.

In addition to the above-described effects, specific effects of the present disclosure will be described together while describing specific details for carrying out the present disclosure below.

DETAILED DESCRIPTION

Figure 1:
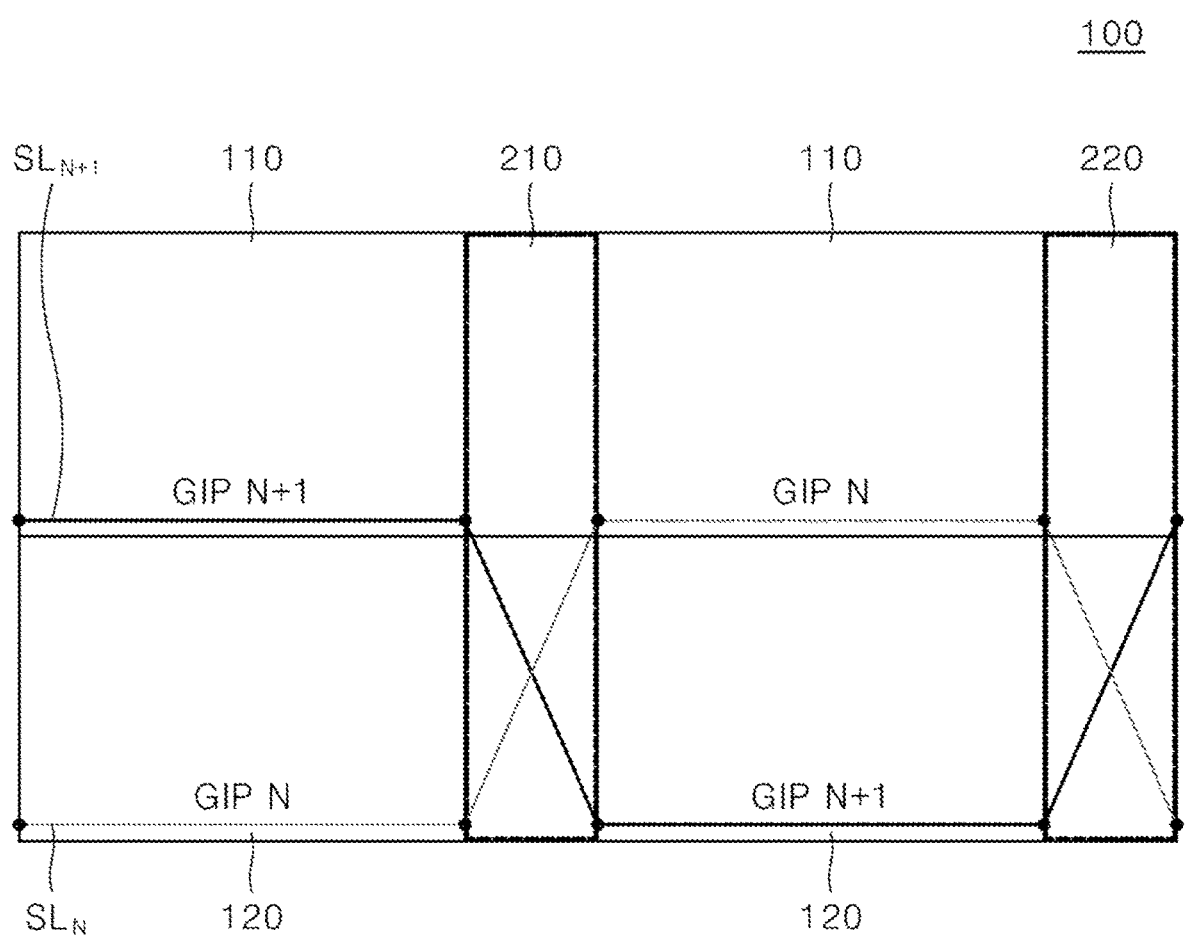
FIG. 1 is a configuration diagram schematically showing a configuration of a display panel according to an embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be within the spirit and scope of the present disclosure.

A shape, a size, a ratio, an angle, a number, etc., disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular may constitute "a" and "an" are intended to include the plural may constitute as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D," this means C inclusive to D inclusive unless otherwise specified.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The term "controller" may include any processor-based or microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), logic circuits, and any other circuit or processor capable of executing the various operations and functions described herein. The above examples are examples only, and are thus not intended to limit in any way the definition or meaning of the term "controller." The controller may also be referred to as a controller circuit or a control circuit.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The features of the various embodiments of the present disclosure may be partially or entirely combined with each other, and may be technically associated with each other or operate with each other. The embodiments may be implemented independently of each other and may be implemented together in an association relationship.

In interpreting a numerical value in the disclosure, an error range may be inherent even when there is no separate explicit description thereof.

In a description of a signal flow relationship, for example, when a signal is transmitted from a node A to a node B, the signal may be transmitted from the node A through a node C to the node B, unless an indication that the signal is transmitted directly from the node A to the node B is specified.

Hereinafter, a display panel according to an embodiment of the present disclosure and a display device including the same will be described.

Figure 2:
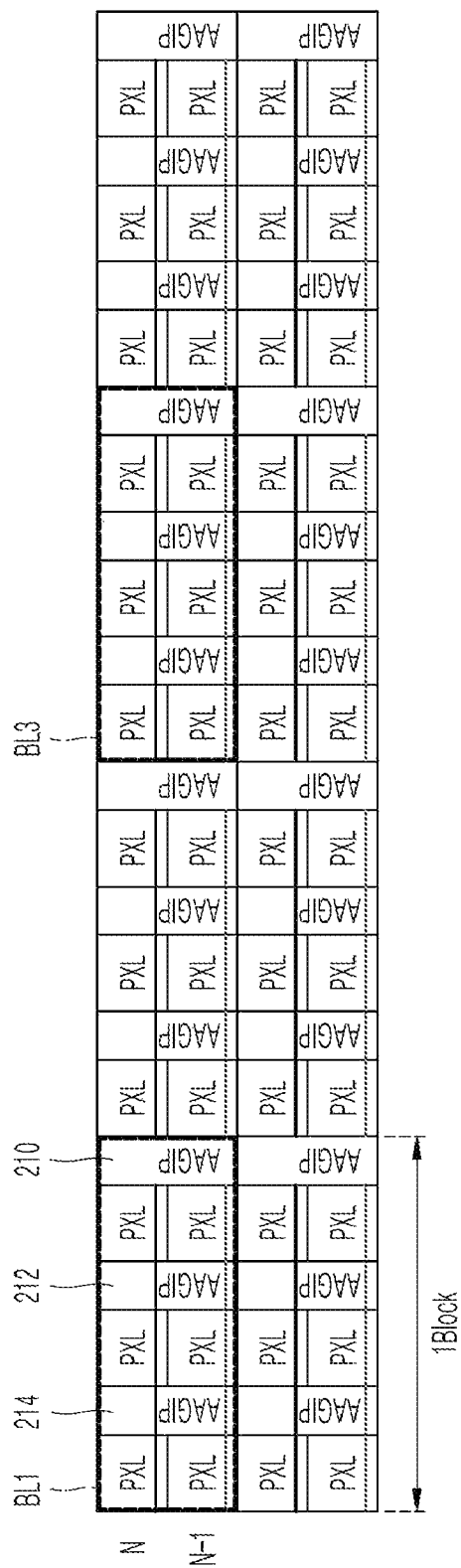
FIG. 2 is a diagram showing an example of a configuration of each block in a display panel according to an embodiment of the present disclosure.
Figure 3:
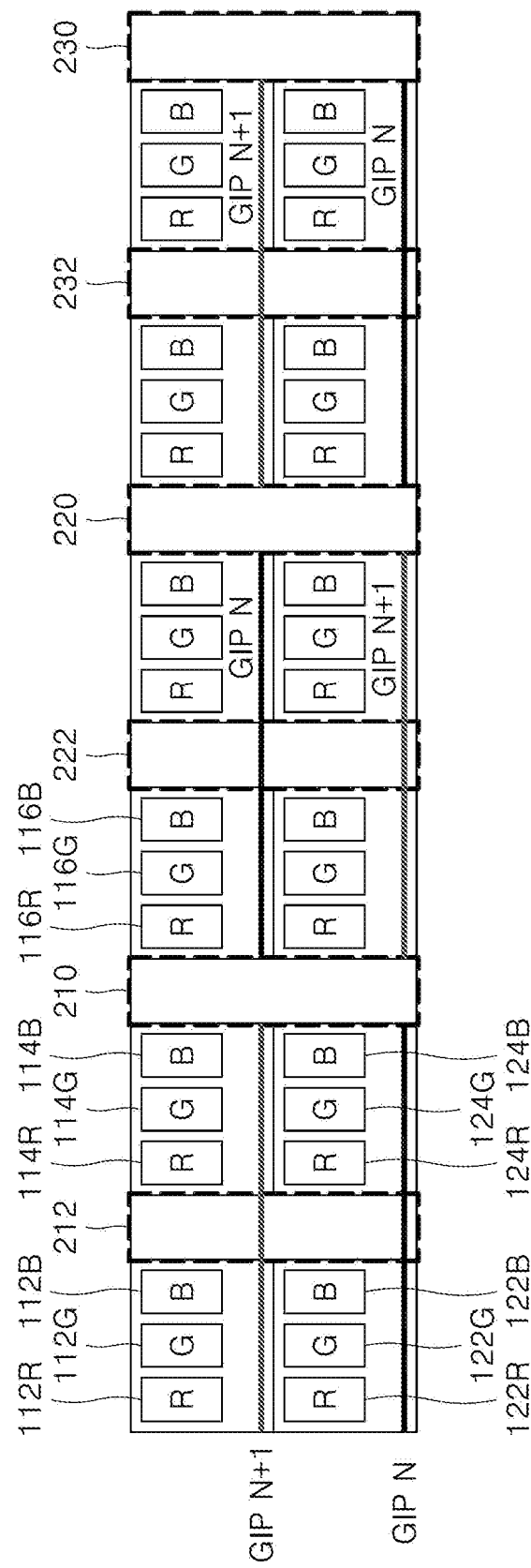
FIG. 3 is a diagram showing an example of a pixel block configuration in each block in FIG.
Figure 4:
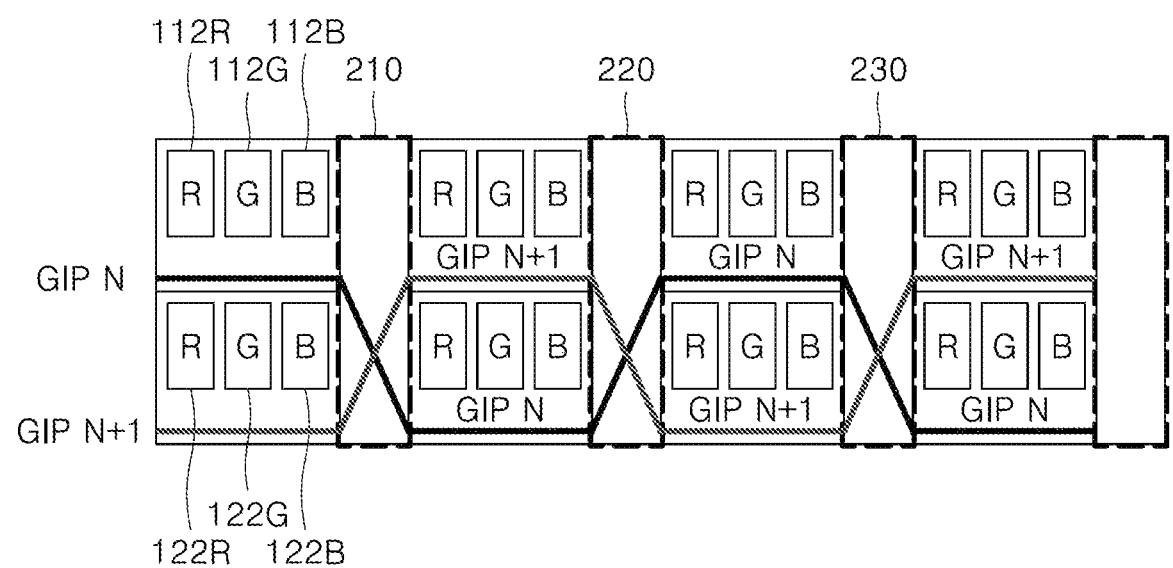
FIG. 4 is a diagram showing an example of a connection configuration of each AAGIP unit in a display panel according to an embodiment of the present disclosure.

FIG. 1 is a schematic diagram showing a configuration of the display panel according to an embodiment of the present disclosure. FIG. 2 is a diagram showing a configuration example of each block in the display panel according to an embodiment of the present disclosure. FIG. 3 is a diagram showing an example of a pixel block configuration in each block of FIG. 2. FIG. 4 is a diagram showing an example of a connection configuration of each AAGIP unit in a display panel according to an embodiment of the present disclosure.

Referring to FIG. 1 to FIG. 4, a display panel 100 according to an embodiment of the present disclosure may include a plurality of pixel blocks 110 and 120 and a plurality of AAGIP units 210 and 220.

The plurality of pixel blocks 110 and 120 may be arranged such that the same pixel blocks may be arranged in the same row. For example, the same first pixel blocks 110 may be arranged in a first row, and the same second pixel blocks 120 may be arranged in a second row.

The plurality of AAGIP units 210 and 220 may be arranged such that one AAGIP unit 210 may be disposed between the plurality of pixel blocks 110 and 120.

One pixel block group may include at least one pixel block. For example, as shown in FIG. 1, one pixel block group may include a first pixel block 110 in a first row and a first column and a second pixel block 120 in a second row and a first column. However, the present disclosure is not limited thereto, and one pixel block group may include pixel blocks arranged in two columns and two rows.

One AAGIP unit may be disposed for each of at least one pixel block. For example, as shown in FIG. 1, one AAGIP unit may be disposed for a group of pixel blocks arranged in one column and two rows. That is, the first AAGIP unit 210 may be disposed for the first pixel block 110 and the second pixel block 120 of a first pixel block group, and the second AAGIP unit 220 may be disposed for the first pixel block 110 and the second pixel block 120 of a second pixel block group.

In an embodiment of the present disclosure, at least one AAGIP unit are disposed in a display area (Active Area) of a display panel and thus may be referred to as 'AAGIP' or 'AAGIP unit.'

Each pixel block may include a plurality of sub-pixels arranged in rows and columns, wherein each sub-pixel includes a light-emitting element OLED. The plurality of sub-pixels may include, for example, at least one sub-pixel among red, green, blue, and white sub-pixels. Each pixel block may include a unit pixel area composed of at least one sub-pixel. A driving element may be disposed in each of at least one sub-pixel. AAGIP elements constituting a stage may be dispersedly arranged in the unit pixel area. An AAGIP element may include an AAGIP TFT and a capacitor.

In a pixel block on one side of an AAGIP unit, an n scan line may be disposed in and along sub-pixels of an n-th row, and an n+1 scan line may be disposed in and along sub-pixels of an (n+1)-th row. For example, as shown in FIG. 1, an N+1 scan line SLN+1 may be disposed in and along the first pixel block 110 on the left side of the first AAGIP unit 210, and an N scan line SLN may be disposed in and along the second pixel block 120 on the left side of the first AAGIP unit 210. In this regard, the sub-pixels of the (n+1)-th row are arranged in the first pixel block 110 on the left side of the first AAGIP unit 210, and the sub-pixels of the n-th row are arranged in the second pixel block 120 on the left side of the first AAGIP unit 210. In an embodiment of the present disclosure, N or n is a natural number or a nonnegative integer.

Further, in pixel block on the other side of the AAGIP unit, an n+1 scan line is disposed in and along sub-pixels of an n-th row, and an n scan line is disposed in and along sub-pixels of a (n+1)-th row. For example, as shown in FIG. 1, an N scan line SLN may be disposed in the right first pixel block 110 around the first AAGIP unit 210, and an N+1 scan line SLN+1 may be disposed in right the second pixel block 120 around the first AAGIP unit 210. In this regard, n-th row sub-pixels are arranged in the right first pixel block 110 around the first AAGIP unit 210, and (n+1)-th row sub-pixels are arranged in the right second pixel block 120 around the first AAGIP unit 210.

The AAGIP unit may electrically connect the N scan line of one side pixel block and the N scan line of the other side pixel block. That is, the AAGIP unit may electrically connect the N scan line disposed in and along sub-pixels of the n-th row of one side pixel block and the N scan line disposed in and along sub-pixels of the (n+1)-th row of the other side pixel block to each other. For example, in FIG. 1, the first AAGIP unit 210 may electrically connect the N scan line SLN of the left second pixel block 120 and the N scan line SLN of the right first pixel block 110 to each other. In this regard, the left second pixel block 120 around the first AAGIP unit 210 and the right first pixel block 110 around the first AAGIP unit 210 are located in different rows.

The AAGIP unit may electrically connect the N+1 scan line of one side pixel block and the N+1 scan line of the other side pixel block to each other. That is, the AAGIP unit may electrically connect the N+1 scan line disposed in and along sub-pixels of the (n+1)-th row of one side pixel block and the N+1 scan line disposed in and along sub-pixels of the n-th row of the other side pixel block to each other. For example, in FIG. 1, the first AAGIP unit 210 may electrically connect the N+1 scan line SLN+1 of the left first pixel block 110 and the N+1 scan line SLN+1 of the right second pixel block 120 to each other. In this regard, the left first pixel block 110 around the first AAGIP unit 210 and the right second pixel block 120 around the first AAGIP unit 210 are located in different rows.

As described above, one AAGIP unit disposed between the plurality of pixel blocks may electrically connect the N scan line of one side pixel block and the N scan line of the other side pixel block located in different rows. In this regard, one pixel block group may be composed of an n-th row pixel block and an (n+1)-th row pixel block.

Further, one AAGIP unit disposed between the plurality of pixel blocks may electrically connect the N+1 scan line of one side pixel block and the N+1 scan line of the other side pixel block located in different rows.

The AAGIP unit having the above configuration may apply an N scan signal to the n scan line of one side pixel block and the n scan line of the other side pixel block, and may apply an N+1 scan signal to the n+1 scan line of one side pixel block and the n+1 scan line of the other side pixel block.

For example, in FIG. 1, the first AAGIP unit 210 may apply an N scan signal GIP N to the N scan line SLN disposed in the second pixel block 120 of the second row and the first column on the left side thereof, and the N scan line SLN disposed in the first pixel block 110 of the first row and the second column on the right side thereof.

Further, in FIG. 1, the first AAGIP unit 210 may apply an N+1 scan signal GIP N+1 to the n+1 scan line SLN+1 disposed in the first pixel block 110 of the first row and the first column on the left side thereof, and the n+1 scan line SLN+1 disposed in the second pixel block 120 of the second row and the second column on the right side thereof.

In one example, one block may include a plurality of pixels PXL and a plurality of AAGIP units 210, 212 and 214 as shown in FIG. 2.

Referring to FIG. 2, a first block BL1 may include pixels PXL of an n-th row and pixels PXL of an (N+1)-th row. That is, the first block BL1 may include pixels arranged in 2 rows and 3 columns and three AAGIP units 210, 212, and 214.

In this regard, in the first block BL1, a first-second AAGIP unit 214 is disposed for the first column pixels, a first-first AAGIP unit 212 is disposed for the second column pixels, and a first AAGIP unit 210 is disposed for the third column pixels.

Further, in the first block BL1, the N scan line SLN may be disposed in and along pixels of first to third columns in an N-th row, while the N+1 scan line SLN−1 may be disposed in and along pixels of first to third columns in an (N+1)-th row.

In FIG. 2, like the first block BL1, each of the second block BL2 and the third block BL3 may include pixels arranged in 2 rows and 3 columns and three AAGIP units 210, 212, and 214, wherein the 2 rows include an N-th row and an (N+1)-th row.

In the second block BL2, the N scan line SLN may be disposed in and along pixels of first to third columns in an N-th row, while the N+1 scan line SLN−1 may be disposed in and along pixels of first to third columns in an (N+1)-th row.

In the third block BL3, the N scan line SLN may be disposed in and along pixels of first to third columns in an N-th row, while the N+1 scan line SLN−1 may be disposed in and along pixels of first to third columns in an (N+1)-th row.

In each of the first block BL1, the second block BL2, and the third block BL3, one pixel PXL may include at least one sub-pixel of red, green, blue, and white sub-pixels. Hereinafter, a pixel may have a reference numeral "PXL" and a sub-pixel may have a reference numeral "PX." Further, the sub-pixel may have a reference numeral "R," "G," "B," or "W" based on a color.

In FIG. 2, it is illustrated that one block includes a plurality of pixels PXL and a plurality of AAGIP units 210, 212, and 214. However, the present disclosure is not limited thereto. One block may be configured in various ways. For example, although not shown in the drawings, one block may include a plurality of pixel blocks and a plurality of AAGIP units, or one block may include one pixel block and one AAGIP unit. In this regard, one pixel block may include at least one sub-pixel.

In a pixel block on one side of the AAGIP unit, an n scan line may be disposed in and along sub-pixels of an n-th row, and an n+1 scan line may be disposed in and along sub-pixels of an (n+1)-th row. For example, the n scan line is disposed in and along sub-pixels of first to third columns of an n-th row on the left side of the first AAGIP unit 210, while the n+1 scan line is disposed in and along sub-pixels of first to third columns of an (n+1)-th row on the left side of the first AAGIP unit 210.

In a pixel block on the other side of the AAGIP unit, an n scan line may be disposed in and along sub-pixels of an n-th row, and an n+1 scan line may be disposed in and along sub-pixels of an (n+1)-th row. The n scan line is disposed in and along sub-pixels of first to third columns of an n-th row on the right side of the first AAGIP unit 210, while the n+1 scan line is disposed in and along sub-pixels of first to third columns of an (n+1)-th row on the right side of the first AAGIP unit 210.

The AAGIP unit may apply an N scan signal to the n scan line of one side pixel block and to the n+1 scan line of the other side pixel block, and may apply an N+1 scan signal to the n+1 scan line of one side pixel block and to the n scan line of the other side pixel block. For example, the first AAGIP unit 210 may apply the same N scan signal to each of the N scan line SLN of the first block BL1 and the N+1 scan line SLN+1 of the second block BL2. Further, the first AAGIP unit 210 may apply the same N+1 scan signal to each of the N+1 scan line SLN+1 of the first block BL1 and the N scan line SLN of the second block BL2.

That is, the AAGIP unit disposed on a predefined block basis may apply different scan signals to the same scan lines of the different blocks, respectively for individual operations thereof.

For example, the first AAGIP unit 210 may apply the N scan signal to the N scan line SLN of the first block BL1 and apply the N+1 scan signal to the N scan line SLN of the second block BL2 for individual operations of adjacent pixel blocks.

Further, the first AAGIP unit 210 may apply the N+1 scan signal to the N+1 scan line SLN+1 of the first block BL1 and may apply the N scan signal to the N+1 scan line SLN+1 of the second block BL2 to perform individual operations of adjacent pixel blocks.

As described above, the AAGIP disposed on a predefined block basis may respectively apply different scan signals to two adjacent pixel blocks in a software manner to perform individual operations of adjacent pixel blocks.

Referring to FIG. 3, a display panel 100 according to an embodiment of the present disclosure may include a plurality of pixel blocks and a plurality of AAGIP units, wherein one pixel block may include at least one sub-pixels R, G, B The plurality of pixel blocks may include, for example, a first row first column pixel block, a second row first column pixel block, a first row second column pixel block, and a second row second column pixel block.

The plurality of AAGIP units may include, for example, a first-first AAGIP unit 212 disposed for the first row first column pixel block and the second row first column pixel block, and a first AAGIP unit 210 disposed for the first row second column pixel block and the second row second column pixel block.

At least one sub-pixel R, G, and B may include, for example, a red sub-pixel 112R rendering red R, a green sub-pixel 112G rendering green G, and a blue sub-pixel 112B rendering blue B in the first row first column pixel block.

In this regard, a N+1 scan line GIP N+1 may be disposed in and along the first row first column pixel block and the first row second column pixel block, and a N scan line GIP N may be disposed in and along the second row first column pixel block and the second row second column pixel block.

That is, one scan line may be disposed in two pixel blocks. Different scan lines may be respectively disposed in different pairs of the two pixel blocks.

In FIG. 3, the N scan line GIP N may be disposed in the first row third column pixel block and the first row fourth column pixel block, and the (N+1)-th scan line GIP N+1 may be disposed in the second row third column pixel block and the second row fourth column pixel block.

As described above, in the display panel according to an embodiment of the present disclosure, one scan line is disposed in each row such that different scan lines may be respectively disposed in different pairs of the two pixel blocks.

Referring to FIG. 4, a display panel according to an embodiment of the present disclosure may include a plurality of pixel blocks and a plurality of AAGIP units, wherein a scan line may be disposed in one pixel block.

The plurality of pixel blocks may include, for example, first column first row, first column second row, second column first row, second column second row, third column first row, third column second row, fourth column first row, and fourth column second row pixel blocks, as shown in FIG. 4

The plurality of AAGIP units may include a first AAGIP unit 210 disposed for the first column first row pixel block and the first column second row pixel block, a second AAGIP unit 220 disposed for the second column first row pixel block and the second column second row pixel block, and a third AAGIP unit 230 disposed for the third column first row pixel block and the third column second row pixel block.

One pixel block may include at least one sub-pixel R, G, B.

An N scan line GIP N may be disposed in the first column first row pixel block, and an N+1 scan line GIP N+1 may be disposed in the first column second row pixel block.

An N+1 scan line GIP N+1 may be disposed in the second column first row pixel block, and an N scan line GIP N may be disposed in the second column second row.

An N scan line GIP N may be disposed in the third column first row pixel block, and the N+1 scan line GIP N+1 may be disposed in the third column second row pixel block.

The N+1 scan line GIP N+1 may be disposed in the fourth column first row pixel block, and the N scan line GIP N may be disposed in the fourth column second row pixel block.

The first GIP unit 210 may electrically connect the N scan line GIP N of the first column first row pixel block and the N scan line GIP N of the second column second row pixel block to each other, and may electrically connect the N+1 scan line GIP N+1 of the first column second row pixel block and the N+1 scan line GIP N+1 of the second column first row pixel block to each other. Hereinafter, the first column first row pixel block to the fourth column second row pixel block may be referred to as the first column first row to the fourth column second row.

The second AAGIP unit 220 may electrically connect the N+1 scan line GIP N+1 of the first row second column pixel block and the N+1 scan line GIP N+1 of the second row third column pixel block to each other and may electrically connect the N scan line GIP N of the second row second column and the N scan line GIP N of the first row third column pixel block to each other.

The third AAGIP unit 230 may electrically connect the N scan line GIP N of the first row third column pixel block and the N scan line GIP N of the second row fourth column pixel block to each other and may electrically connect the N+1 scan line GIP N+1 of the second row third column pixel block and the N+1 scan line GIP N+1 of the first row fourth column pixel block to each other.

As described above, in the display panel according to an embodiment of the present disclosure, different scan lines are respectively disposed in two pixel blocks in each row. The AAGIP unit connects a scan line of an upper pixel block on one side of the AAGIP unit to a scan line of a lower pixel block on the other side of the AAGIP unit to each other and connects a scan line of a lower pixel block on one side of the AAGIP unit to a scan line of an upper pixel block on the other side of the AAGIP unit to each other FIG. 5 is a diagram showing an example of applying different AAGIP control signals having different timings to different blocks in a display panel according to an embodiment of the present disclosure.

Figure 5:
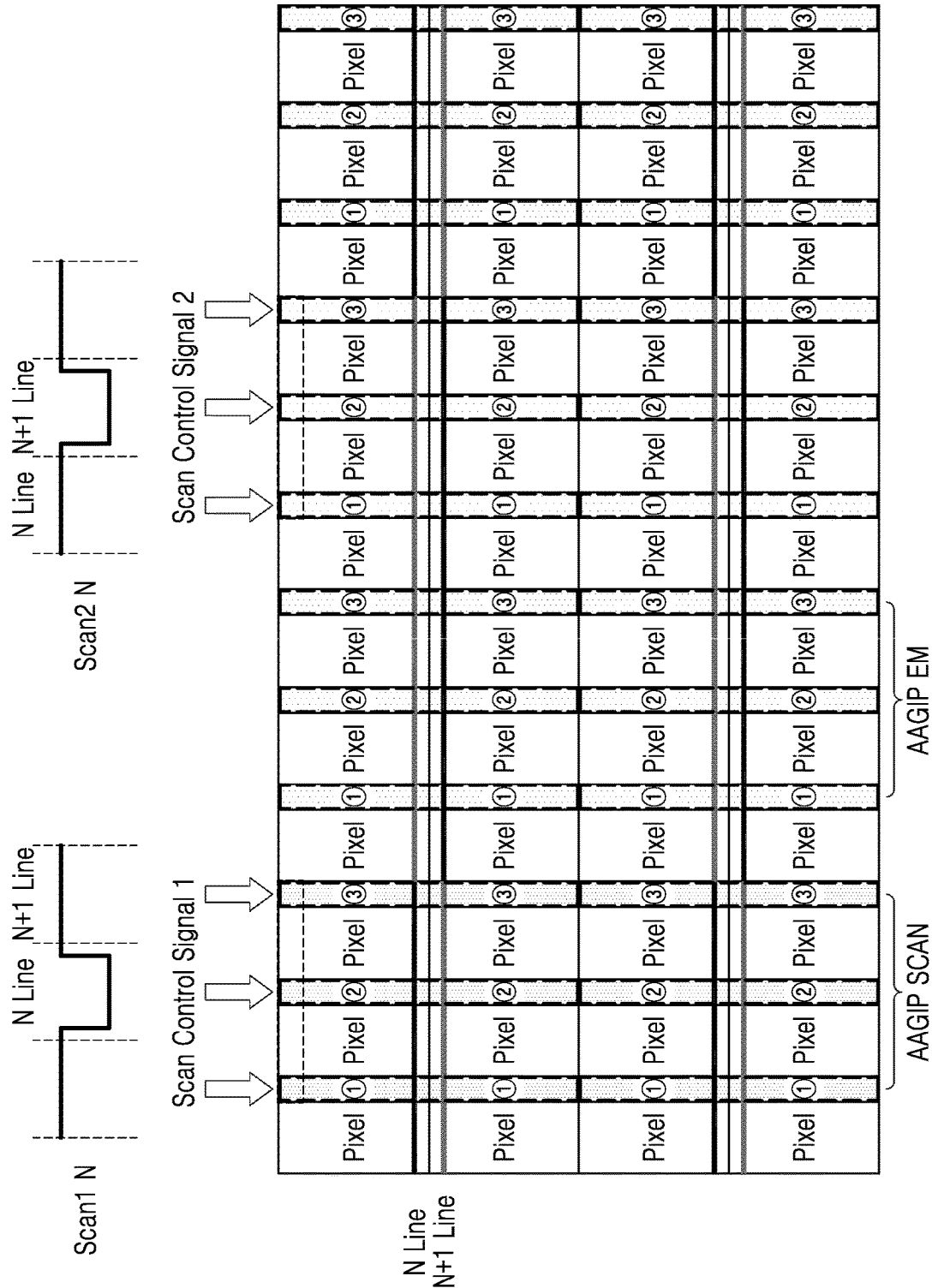
FIG. 5 is a diagram showing an example of applying AAGIP control signals having different timings to different blocks in a display panel according to an embodiment of the present disclosure.

Referring to FIG. 5, an AAGIP unit according to an embodiment of the present disclosure may include a scan AAGIP unit AAGIP SCAN and a light-emission AAGIP unit AAGIP EM.

In the display area, the scan AAGIP units AAGIP SCAN are arranged to be spaced from each other by a predefined spacing (①, ②, ③), and the light-emission AAGIP units AAGIP EM are arranged to be spaced from each other by a predefined spacing (①, ②, ③).

For example, when three pixels constitute a unit pixel, each scan AAGIP unit AAGIP SCAN and each light-emission AAGIP unit AAGIP EM may be disposed on a pixel basis.

In this case, three scan AAGIP units AAGIP SCAN may be arranged (①, ②, ③) for the thee pixels, respectively. Three light-emission AAGIP units AAGIP EM may be arranged (①, ②, ③) for the thee pixels, respectively. The present disclosure is not limited to this arrangement.

As shown in FIG. 5, in the display area of the display panel according to an embodiment of the present disclosure, groups of the scan AAGIP units AAGIP SCAN and groups of light-emission AAGIP units AAGIP EM may be alternately arranged with each other.

The AAGIP unit according to an embodiment of the present disclosure may apply the AAGIP control signals Control Signal having different timings to one side pixel block and the other side pixel block, respectively.

When the N scan signal is a high level pulse signal, the N+1 scan signal may be a low level pulse signal. When the N scan signal is a low level pulse signal, the N+1 scan signal may be a high level pulse signal.

In FIG. 5, the first scan AAGIP units Scan1 N (①, ②, ③) may apply a first scan control signal Scan Control Signal 1 of a low level to the N scan line N Line. In this regard, a scan TFT of each pixel may be turned on based on a low level scan control signal and may be turned off based on a high level scan control signal.

Further, the first scan AAGIP units (①, ②, ③) may apply the first scan control signal Scan Control Signal 1 of a high level to the N+1 scan line N+1 Line.

Accordingly, the scan TFTs of the pixels connected to the N scan line N Line may be turned on, and the scan TFTs of the pixels connected to the N+1 scan line N+1 Line may be turned off.

In FIG. 5, the second scan AAGIP units Scan2 N (①, ②, ③) may apply a second scan control signal Scan Control Signal 2 of a low level to a N+1 scan line N+1 Line, and may apply the second scan control signal Scan Control Signal 2 of a high level to a N scan line N Line.

Accordingly, the scan TFTs of the pixels connected to the N+1 scan line N+1 Line may be turned on, and the scan TFTs of the pixels connected to the N scan line N Line may be turned off.

Figure 6:
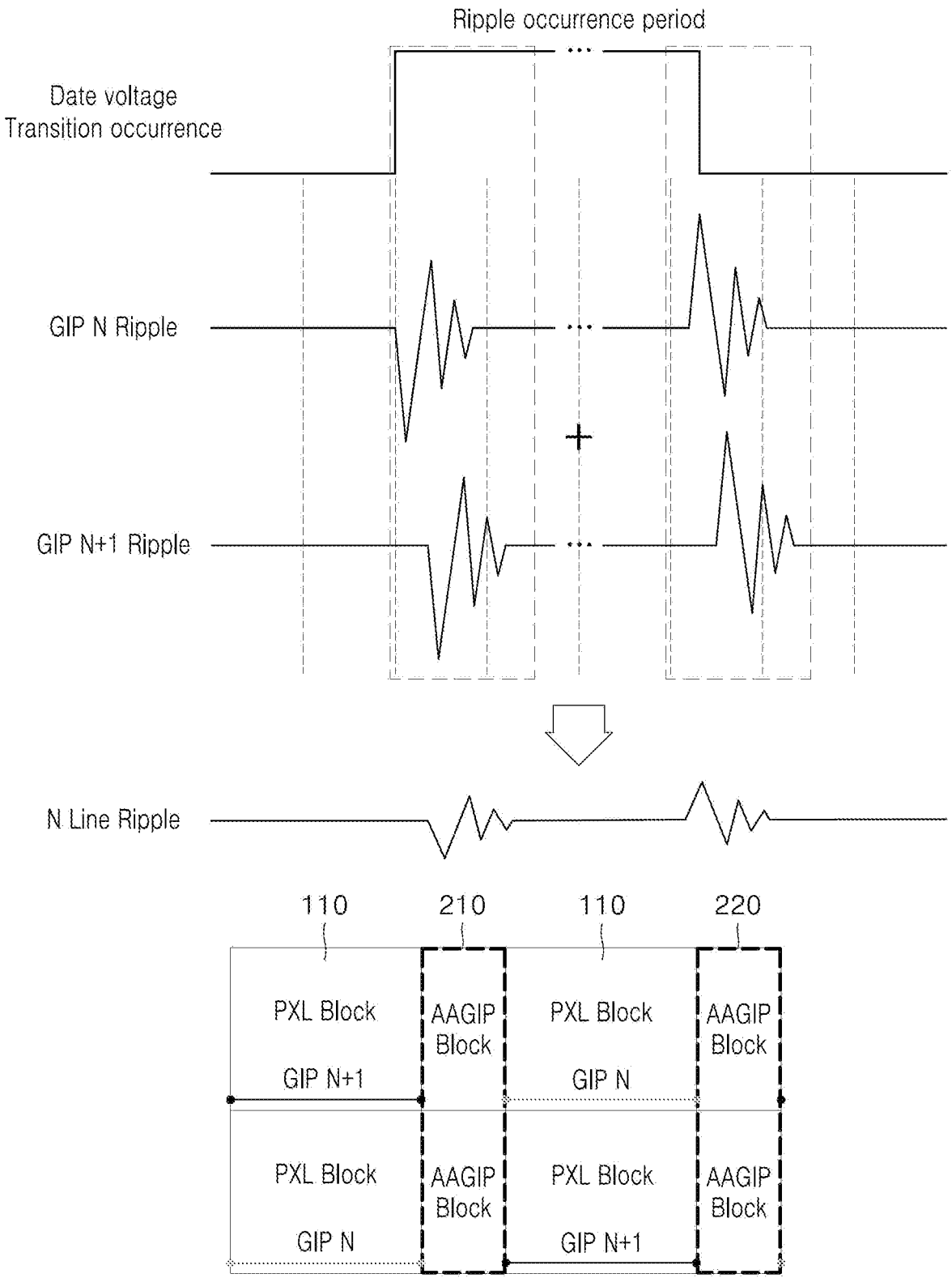
FIG. 6 is a diagram showing an example in which ripple is reduced as a scan line is switched through an AAGIP unit when data voltage fluctuation occurs in a display panel according to an embodiment of the present disclosure.

FIG. 6 is a diagram showing an example in which the ripple is reduced as the scan line is switched through the AAGIP unit when data voltage fluctuation occurs in the display panel according to an embodiment of the present disclosure.

Referring to FIG. 6, in the display panel according to an embodiment of the present disclosure, the first AAGIP unit 210 may be disposed for the first pixel block 110 of the first column first row and the second pixel block 120 of the first column second row, while the second AAGIP unit 220 may be disposed for the first pixel block 110 of the first row second column and the second pixel block 120 of the second row second column.

The N+1 scan line GIP N+1 may be disposed in the first pixel block 110 of the first row and first column, and the N scan line GIP N may be disposed in the second pixel block 120 of the second row first column.

The N scan line GIP N may be disposed in the first pixel block 110 of the first row second column, and the N+1 scan line GIP N+1 may be disposed in the second pixel block 120 of the second row second column.

When the data voltage transition occurs in the display area, GIP N ripple signal GIP N Ripple may occur in the N scan line GIP N, and GIP N+1 ripple signal GIP N+1 Ripple may occur in the N+1 scan line GIP N+1.

However, in the display panel according to an embodiment of the present disclosure, the scan line is switched in the first AAGIP unit 210 and the second AAGIP unit 220 for a period in which the ripple signal occurs according to the data voltage transition. Thus, for example, the ripple signal N line ripple related to the N scan line is significantly reduced.

Figure 7:
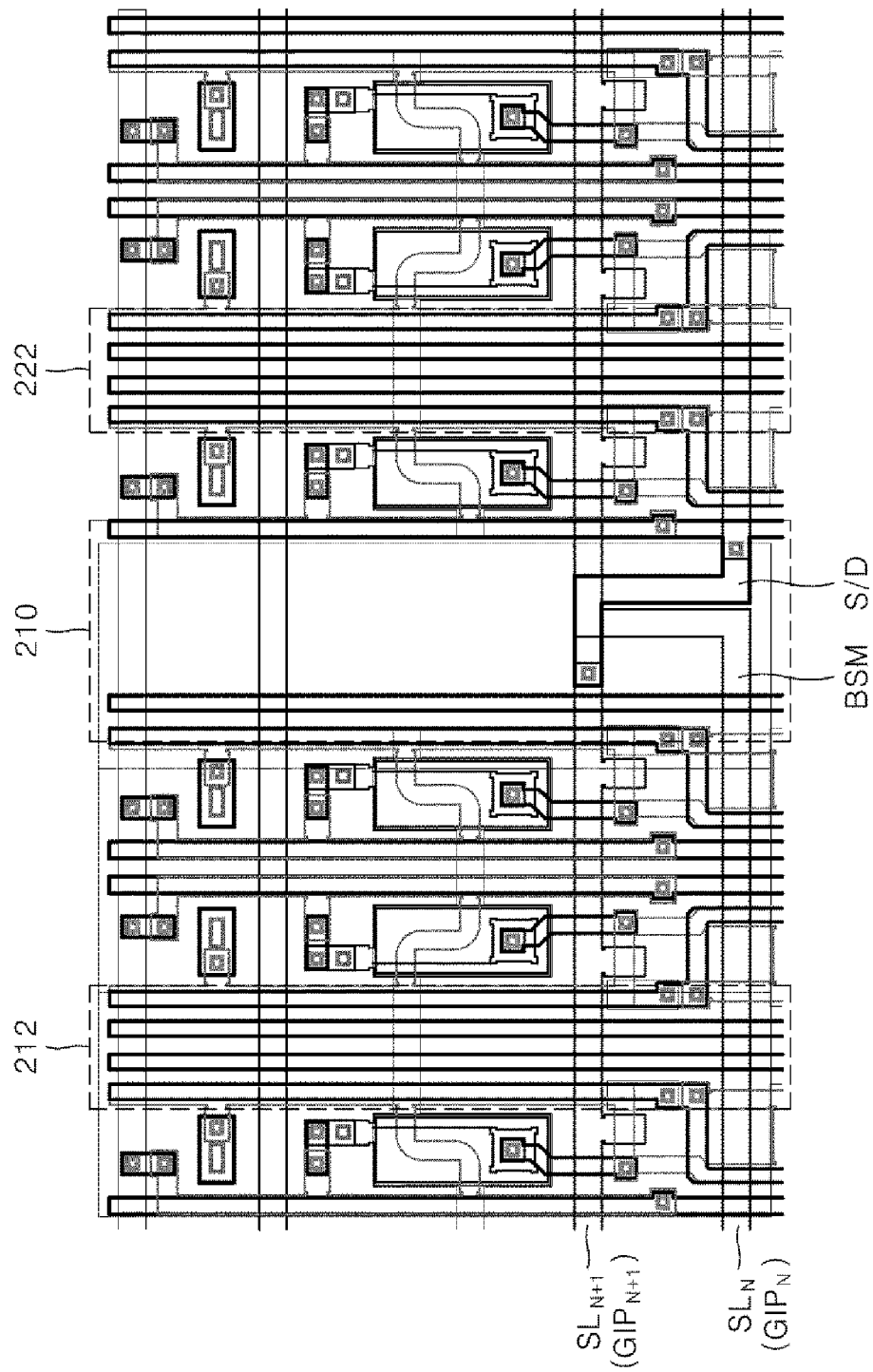
FIG. 7 is a diagram showing an example in which an AAGIP unit actually connects scan lines of neighboring pixel blocks to each other according to an embodiment of the present disclosure.

FIG. 7 is a diagram showing an example in which the AAGIP unit actually connects scan lines of neighboring pixel blocks to each other according to an embodiment of the present disclosure.

Referring to FIG. 7, the display panel according to an embodiment of the present disclosure may include a plurality of pixel blocks and a plurality of AAGIP units 210, 212, and 220.

The plurality of AAGIP units 210, 212, and 220 may be arranged such that a first-first AAGIP unit 212 is disposed for a first column first row pixel block and a first column second row pixel block, a first AAGIP unit 210 is disposed for second column first row, third column first row, second column second row, and third column second row pixel blocks, and a second-first AAGIP unit 222 is disposed for fourth column first row and fourth column second row pixel blocks.

In this regard, the N+1 scan line SLN+1 is disposed in the first column first row, second column first row, and third column first row pixel blocks as the left pixel blocks around the first AAGIP unit 210. The N scan line SLN may be disposed in the first column second row, second column second row, and third column second row pixel blocks as the left pixel blocks around the first AAGIP unit 210.

Further, the N scan line SLN may be disposed in the fourth column first row, fifth column first row, and sixth column first row pixel blocks as the right pixel blocks around the first AAGIP unit 210. The N+1 scan line SLN+1 may be disposed in the fourth column first row, fifth column second row, and sixth column second row pixel blocks as the right pixel blocks around the first AAGIP unit 210.

Accordingly, the first AAGIP unit 210 may connect the N+1 scan line SLN+1 in a first row of the left pixel block and the N+1 scan line SLN+1 in a second row of the right pixel block to each other through a source/drain connection line S/D.

Further, the first AAGIP unit 210 may connect the N scan line SLN in a second row of the left pixel block and the N scan line SLN in a first row of the right pixel block to each other through a bottom shield metal BSM.

For example, when a TFT of a pixel is produced, a BSM connection line may be formed on a base substrate in the first AAGIP unit 210 using a mask such that the N scan lines SLN of two pixel blocks are connected to each other through the bottom shield metal BSM.

Further, when the source electrode and the drain electrode are produced, a SD connection line may be formed in the first AAGIP unit 210 using a mask such that the N+1 scan lines SLN+1 of the two pixel blocks are connected to each other through the source/drain connection line S/D. In this regard, the source/drain connection line S/D may not use the mask, and both opposing ends of the source/drain connection line S/D and both opposing ends of the N+1 scan lines SLN+1 of the two pixel blocks may be respectively connected to each other through contact holes.

Figure 8:
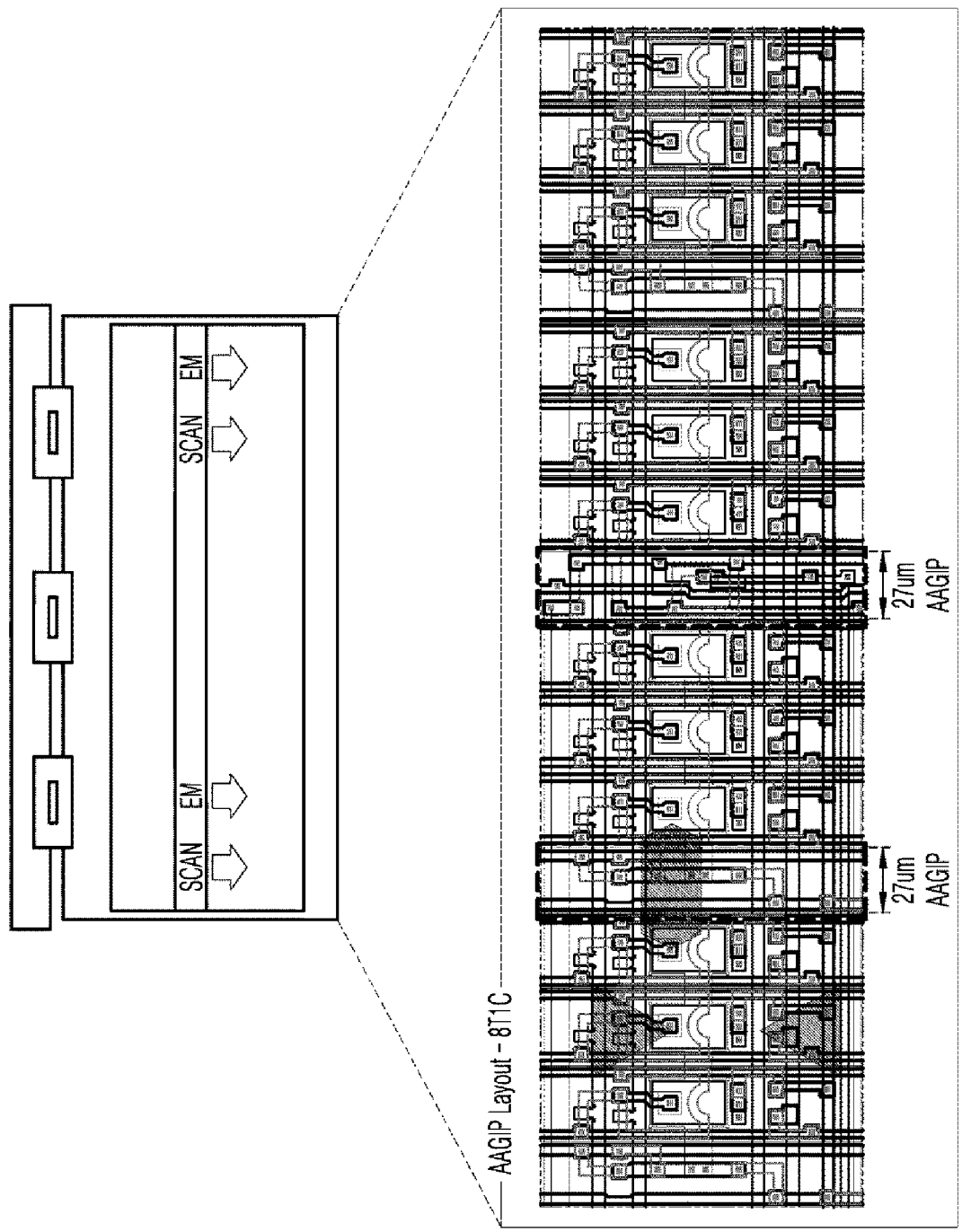
FIG. 8 is an illustrative view showing a width of an AAGIP unit when one sub-pixel has a 8T1C structure in a display panel according to an embodiment of the present disclosure.

FIG. 8 is a view showing a width of the AAGIP unit when one sub-pixel has a 8T1C structure in the display panel according to an embodiment of the present disclosure. Referring to FIG. 8, in the display panel according to an embodiment of the present disclosure, an AAGIP unit may be disposed on a predefined number of pixel blocks basis and one pixel block may include at least one sub-pixel.

In this regard, when one sub-pixel has a 8T1C structure, the AAGIP unit may have a width of, for example, 27 μm in a row direction in which the scan line extends.

That is, the AAGIP unit includes the scan AAGIP unit AAGIP SCAN and the light-emission AAGIP unit AAGIP EM. Each of the scan AAGIP unit AAGIP SCAN and the light-emission AAGIP unit AAGIP EM may have a width of 27 μm.

Figure 9:
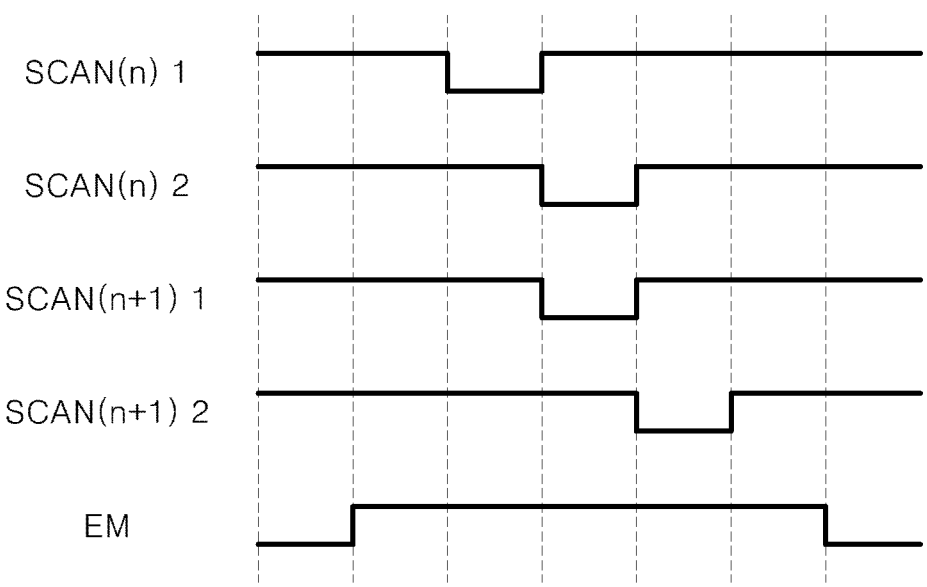
FIG. 9 is a diagram showing an example of respective applying scan signals to 2 scan lines in a display panel according to an embodiment of the present disclosure.

FIG. 9 is a diagram showing an example of respectively applying scan signals to 2 scan lines in a display panel according to an embodiment of the present disclosure.

Referring to FIG. 9, the display panel according to an embodiment of the present disclosure, the AAGIP unit may apply a first scan N signal SCAN(n) 1 of a low level to a left first scan line Scan 1 around the AAGIP unit and may apply a second scan N signal SCAN(n) 2 of a low level having a next timing to a right second scan line Scan 2 around the AAGIP unit.

Further, the AAGIP unit may apply a first scan N+1 signal SCAN(n+1) 1 to a left first scan line Scan 1 around the AAGIP unit and may apply a second scan N+1 signal SCAN(n+1) 2 of a low level having a next timing to a right second scan line Scan 2 around the AAGIP unit.

As described above, the display panel according to an embodiment of the present disclosure may apply different scan signals to the same scan lines (for example, the same first scan line Scan 1 or the same second scan lines Scan 2) of the adjacent pixel blocks in a zigzag manner.

Therefore, the AAGIP scan signal applied to each pixel block may vary such that the influence of the data voltage fluctuation (data line transition) may be reduced or minimized.

Figure 10:
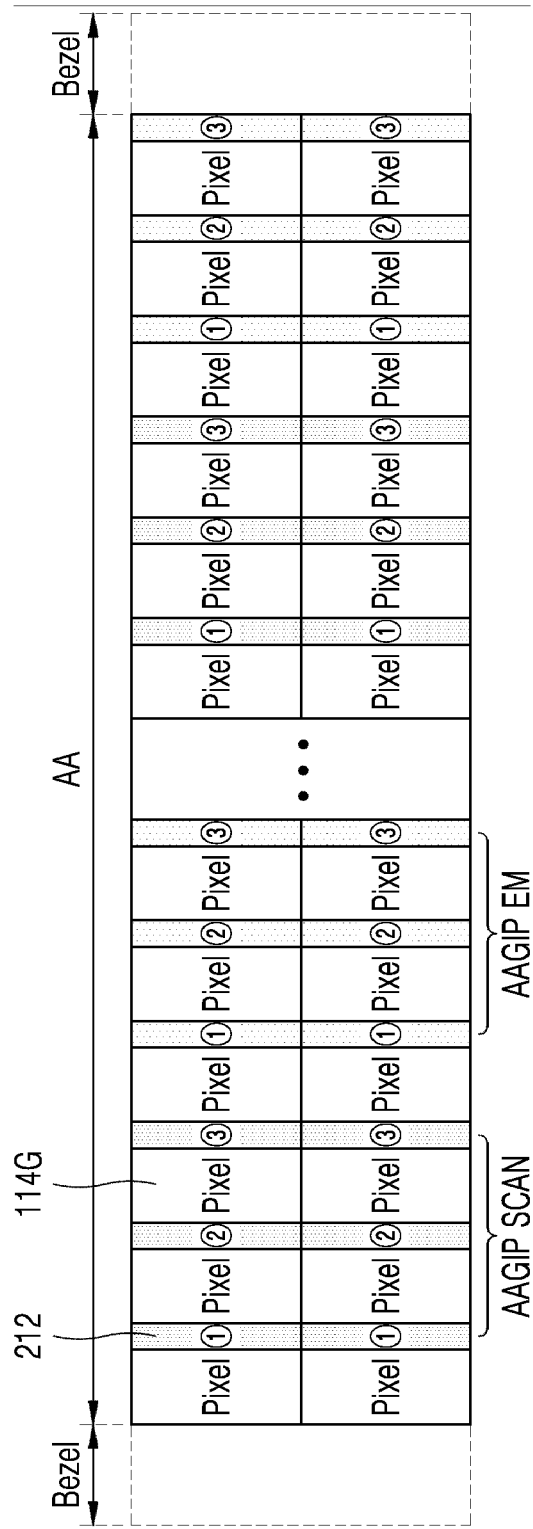
FIG. 10 and FIG. 11 are diagrams showing an example in which a bezel area is secured due to an AAGIP unit in a display panel according to an embodiment of the present disclosure.
Figure 11:
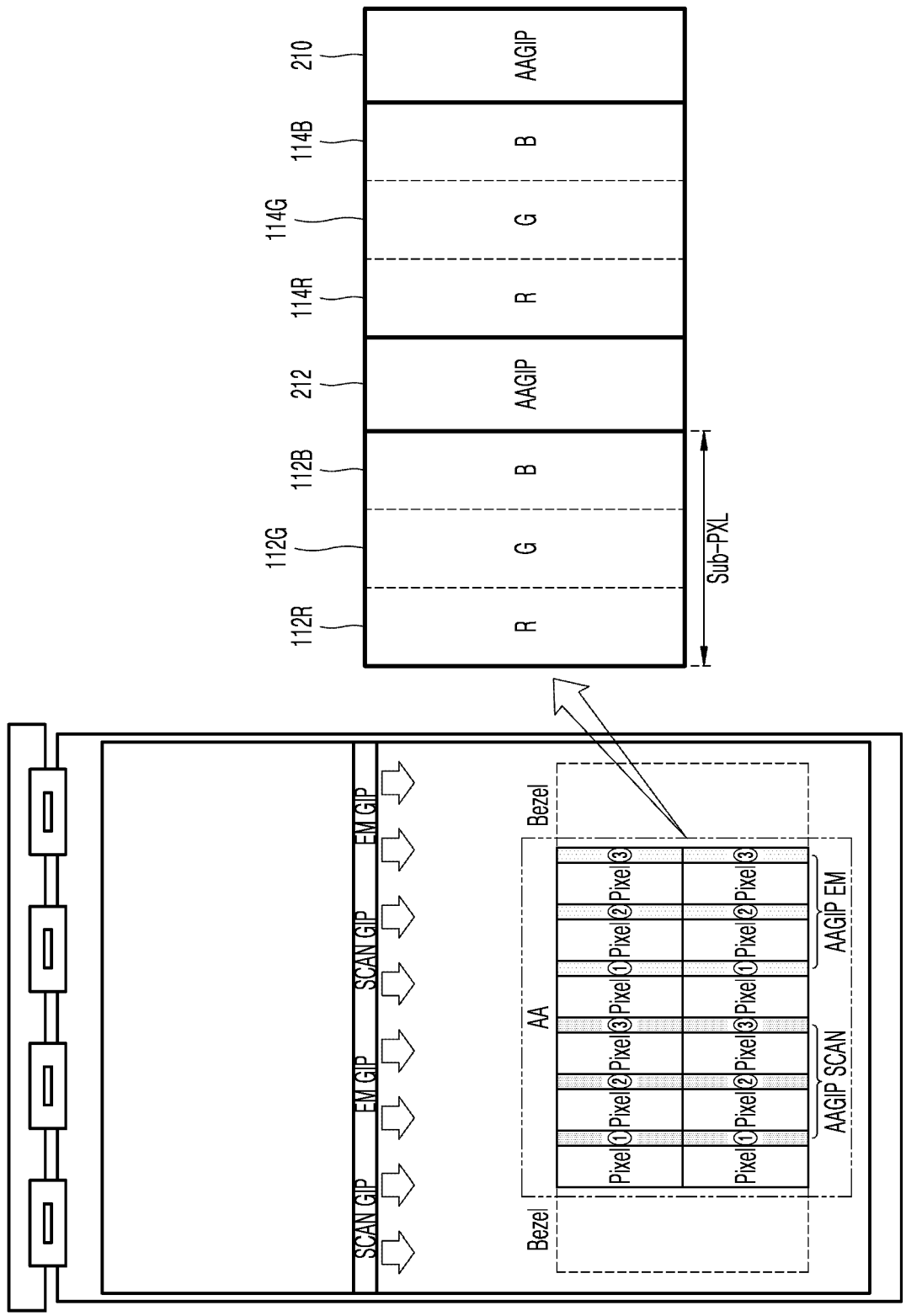

FIG. 10 and FIG. 11 are diagrams showing an example in which a bezel area is secured by the AAGIP unit in a display panel according to an embodiment of the present disclosure.

Referring to FIG. 10 and FIG. 11, in the display panel according to an embodiment of the present disclosure, one or more AAGIP units are disposed in the display area AA such that the gate driver circuit conventionally existing in the non-display area NA may be removed. Therefore, a bezel area of the non-display area at each of both opposing sides of the display panel may be wider.

In the display area AA, an AAGIP unit may be disposed per pixels arranged in one column and two rows. In this regard, one pixel may include at least one sub-pixels R, G, B.

In this regard, the AAGIP unit may include scan AAGIP units AAGIP SCAN respectively disposed for the pixels of 3 columns, and light-emission AAGIP units AAGIP EM respectively disposed for the pixels of next 3 columns.

One sub-pixel area Sub-PXL may include, for example, first red R sub-pixel 112R, first green G sub-pixel 112G, first blue B sub-pixel 112B, and the like.

Therefore, in the display panel, a first-first AAGIP unit 212 may be disposed in a subsequent manner to the first red R sub-pixel 112R, the first green G sub-pixel 112G, and the first blue B sub-pixel 112B, and the first AAGIP unit 210 may be disposed in a subsequent manner to the second red R sub-pixel 114R, the second the green G sub-pixel 114G and the second blue B sub-pixel 114B.

In this way, the AAGIP elements constituting the stage of the gate driver circuit may be dispersedly arranged in the display area AA, such that the widths of the left and right bezel areas of the display panel may be secured.

Accordingly, the display panel according to an embodiment of the present disclosure may further secure the widths of the left and right bezel areas respectively on the left and right sides of the display area AA.

Figure 12:
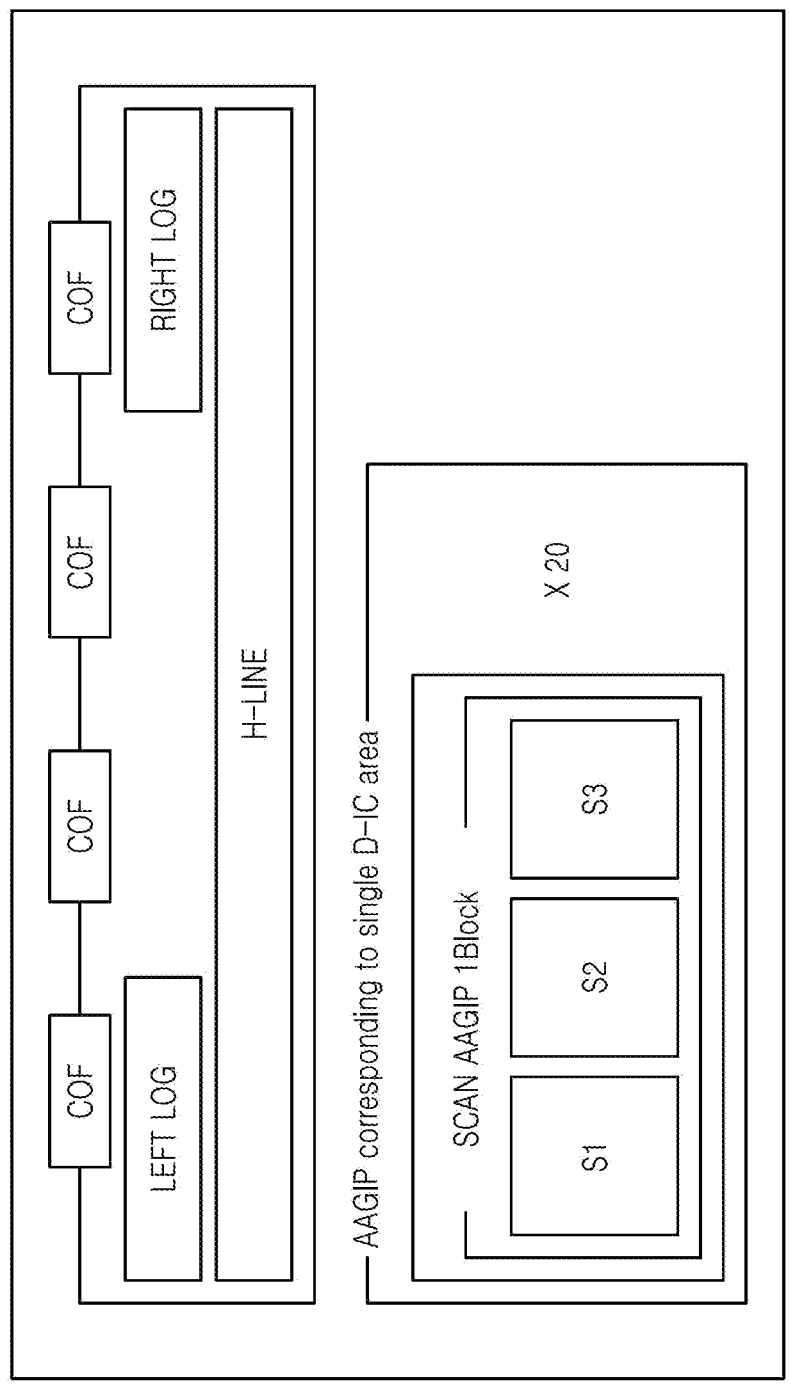
FIG. 12 is a configuration diagram showing an example in which an AAGIP unit is disposed for each data driver according to an embodiment of the present disclosure.

FIG. 12 is a configuration diagram showing an example in which the AAGIP unit is disposed for each data driver according to an embodiment of the present disclosure.

Referring to FIG. 12, when the AAGIP unit according to an embodiment of the present disclosure is applied to a display device, the AAGIP unit according to an embodiment of the present disclosure may be configured such that a single data driver D-IC area may correspond to three scan blocks S1, S2, and S3.

In a display panel according to an embodiment of the present disclosure, a signal line Line on Glass (LOG) may be formed in a non-display area NA. Various control signals VSS, VDD, CLK, VST, and RESET from a timing controller T-conl (not shown) may be applied to the AAGIP unit through COF (Chip On Film) of the data driver D-IC and the signal line LOG.

In this regard, the signal line LOG may include a left signal line LEFT LOG and a right signal line RIGHT LOG around a center of the display panel.

In the display panel, a horizontal scan line H-LINE may be disposed, and one scan AAGIP block SCAN AAGIP 1 Block may be disposed for a single data driver D-IC area.

Alternatively, in the display panel, 20 scan AAGIP blocks may correspond to the single data driver D-IC area. In this regard, each of the scan AAGIP blocks may include three scan blocks S1, S2, and S3.

In one example, an embodiment of the present disclosure may implement a display device including the display panel 100 of the above-described configuration.

The display device according to an embodiment of the present disclosure may include the display panel 100 as described above, and a luminance controller, a data driver, a light-emission controller, a power supply, and a timing controller which are not shown in the drawing.

The luminance controller may provide one gamma set selected from a plurality of gamma sets each including a plurality of gamma data to the data driver, and provide dimming data corresponding to the selected gamma set to the light-emission controller.

The above-described display panel 100 may include the display area AA and the non-display area NA.

In the display area AA, a plurality of scan lines SL respectively disposed in rows and a plurality of data lines DL respectively disposed in columns may intersect each other, and each pixel may be disposed at each intersection therebetween. Each pixel may include at least one sub-pixel R, G, B, etc. Accordingly, at least one sub-pixel may be disposed at each intersection.

For example, the display panel 100 may include an organic substrate or a plastic substrate, and a plurality of scan lines SL and a plurality of data lines DL, and red, green, and blue sub-pixels R, G, and B at the intersections between the scan lines SL and the data line DL, on the organic substrate or the plastic substrate. One pixel including one or more sub-pixels R, G, B, W, etc., may be referred to as a 'unit pixel.'

In this regard, each of the sub-pixels may include an organic electroluminescent diode OLED. Each of the plurality of scan lines SL may be disposed in each of rows of the plurality of sub-pixels, while each of the plurality of data lines DL may be disposed in each of columns of the plurality of sub-pixels. Accordingly, the plurality of sub-pixels may include the plurality of light-emitting diodes OLED arranged in rows and columns.

The scan and data lines SL and DL of the display panel 100 may be respectively connected to the AAGIP unit disposed in the display area AA and the data driver formed out of the display panel 100. Further, the power voltage supply lines VDD, Vini, and VSS extending in a direction parallel to the data line DL may be further formed in the display panel 100 and may be connected to each of the pixels.

Further, each pixel may include at least one organic electroluminescent diode OLED, a storage capacitor Cst, switching thin-film transistors T1 to T9 and a driving thin-film transistor DT. In this regard, the organic electroluminescent diode OLED may include a first electrode (hole injection electrode), an organic compound layer, and a second electrode (electron injection electrode).

The organic compound layer may include a light-emitting layer in which light is actually emitted, and may further include various organic layers for efficiently transferring carriers including holes or electrons to the light-emitting layer. These organic layers may include a hole injection layer and a hole transport layer positioned between the first electrode and the light-emitting layer, and an electron injection layer and an electron transport layer positioned between the second electrode and the light-emitting layer.

Further, the switching and driving thin-film transistors T1 to T9, and TD may be connected to the scan line SL and the control signal supply line EL and the data line DL. The switching thin-film transistors T1 to T9 may be turned on based on a gate voltage input to the scan line SL, and thus may transmit a data voltage input to the data line DL to the driving thin-film transistor TD. The storage capacitor Cst may be connected to and disposed between the thin-film transistor and the power supply line, may be charged with the data voltage transmitted from the thin-film transistor, and the charged state thereof may be maintained for 1 frame.

Moreover, the driving thin-film transistor TD may be connected to the power supply line and the storage capacitor Cst and may supply a drain current corresponding to a voltage difference between voltages of the gate electrode and the source electrode thereof to the organic electroluminescent diode OLED. Accordingly, the organic electroluminescent diode OLED emits light based on the drain current. In this regard, the driving thin-film transistor TD includes a gate electrode, a source electrode and a drain electrode, and an anode electrode of the organic electroluminescent diode OLED may be connected to one electrode of the driving thin-film transistor TD.

The AAGIP unit may apply a scan signal to the plurality of scan lines SL. For example, the AAGIP unit may sequentially apply a gate voltage to the pixels on one horizontal line basis in response to a gate control signal GCS. This AAGIP unit may be implemented as a shift register having a plurality of stages that sequentially output a high-level gate voltage every 1 horizontal (1H) period.

The data driver may apply a data signal to the plurality of data lines DL. For example, the data driver receives an image signal of a digital waveform applied from the timing controller, converts the image signal into a data voltage as an analog voltage having a gray level value that each sub-pixel may process, and then supplies the data voltage to each sub-pixel through the data lines DL in response to a data control signal DCS input thereto. In this regard, the data driver may convert the image signal into the data voltage based on multiple reference voltages supplied from a reference voltage supplier (not shown).

Further, when the data driver receives one gamma set selected from the luminance controller, the data driver may provide a low-potential voltage VSS and an initialization voltage Vini corresponding to the one selected gamma set based on a look-up table to the display panel 100.

The light-emission controller may apply a light-emitting control signal EM to the plurality of pixels.

The power supply may provide a high-potential voltage VDD, a low-potential voltage VSS, a reference voltage Vref, and an initialization voltage Vini to each pixel.

The timing controller may control the AAGIP unit and the data driver. For example, the timing controller receives an image signal, a clock signal, and timing signals such as vertical and horizontal synchronization signals from an external system, generates the gate control signal GCS and the data control signal DCS, based on the received signals, and provides respectively the gate control signal GCS and the data control signal DCS to the AAGIP unit and the data driver.

In this regard, the horizontal synchronization signal indicates a time it takes to display one line of a screen, and the vertical synchronization signal indicates a time it takes to display a screen of one frame. Further, the clock signal refers to a signal on which control signals of a gate and each of the drivers are generated based.

In one example, the timing controller may be connected to an external system through a predetermined interface and may receive an image-related signal and a timing signal output therefrom at high speed without noise. The interface may include a LVDS (Low Voltage Differential Signal) scheme interface or a TTL (Transistor-Transistor Logic) scheme interface.

Further, the timing controller according to an embodiment of the present disclosure may have an embedded microchip (not shown) therein including a compensation model that generates a compensation value for a data voltage based on current deviation of each pixel. Thus, the timing controller may apply the voltage compensation value to the image signal to be provided to the data driver. Thus, the voltage compensation value has been reflected in the data voltage supplied from the data driver.

The present disclosure may be applied to an organic light-emitting display device operating in a bottom-emission scheme. However, the disclosure is not limited thereto. The present disclosure may be applied to an organic light-emitting display device which operates in a top-emission or dual-emission scheme, when necessary.

Figure 13:
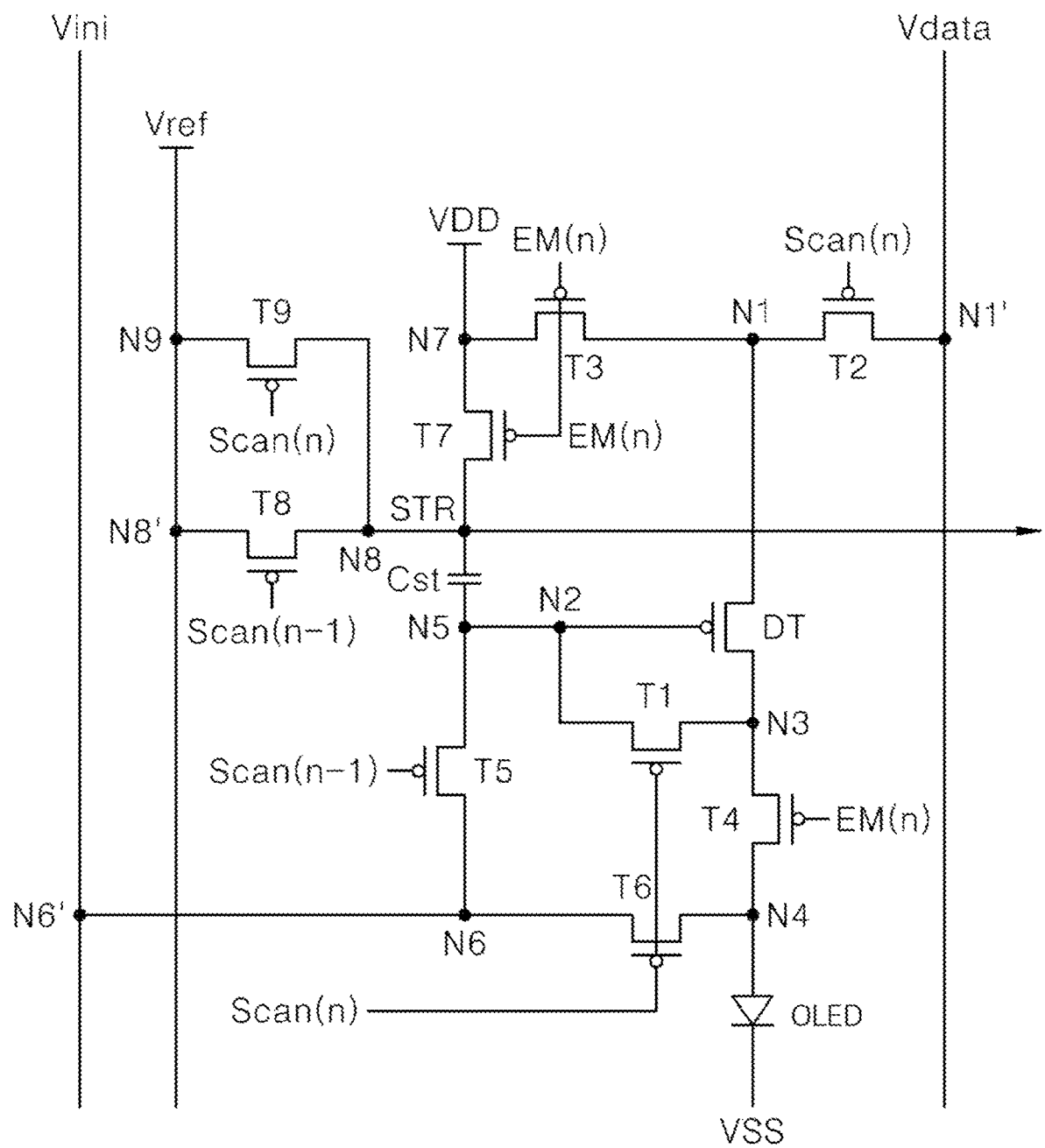
FIG. 13 is a diagram showing a circuit configuration of one sub-pixel disposed in a display area of a display panel according to an embodiment of the present disclosure.

FIG. 13 is a diagram showing a circuit configuration of one sub-pixel PX disposed in a display area of the display panel according to an embodiment of the present disclosure.

Referring to FIG. 13, one sub-pixel PX according to an embodiment of the present disclosure may include a light-emitting element OLED, a driving element DT, a storage capacitor Cst, and a compensation circuit.

The light-emitting element OLED may be embodied as, for example, an organic electroluminescent diode OLED, and may include an anode electrode as a first electrode and a cathode electrode as a second electrode.

The driving element DT may be embodied as, for example, a driving thin-film transistor DT, and may electrically connected to the light-emitting element, and may control current flowing through the light-emitting element.

One electrode of the storage capacitor Cst may be electrically connected to the driving element DT.

The compensation circuit may compensate for change in a threshold voltage of the driving element DT. To this end, the compensation circuit may include first to fourth switching elements T1 to T4 and fifth to ninth switching elements T5 to T9.

Each of the first to ninth switching elements T1 to T9 and the driving element DT may be implemented as TFT having an N-type or P-type MOSFET (Metal Oxide Semiconductor Field Effect Transistor) structure. An example in which each of the first to ninth switching elements T1 to T9 and the driving element DT is implemented as TFT having the P-type MOSFET (Metal Oxide Semiconductor Field Effect Transistor) structure is described in a following embodiment. However, the present disclosure is not limited thereto. The TFT is a three-electrode element including a gate electrode, a source electrode and a drain electrode. The source electrode supplies a carrier to the TFT. In the transistor, the carriers may flow from the source electrode. The drain electrode refers to an electrode through which the carrier exits the TFT. That is, in the MOSFET, the carriers flow from the source electrode to the drain electrode. In a N-type MOSFET (NMOS), the carrier is an electron, and thus, a voltage of the source electrode is lower than a voltage of the drain electrode so that the electrons may flow from the source electrode to the drain electrode. In the n-type MOSFET, the electrons flow from the source electrode to the drain electrode, such that current flows from the drain electrode to the source electrode. In a P-type MOSFET (PMOS), carriers are hole holes, and thus the voltage of the source electrode is higher than the voltage of the drain electrode so that holes may flow from the source electrode to the drain electrode. In the P-type MOSFET, current flows from the source electrode to the drain electrode because the holes flow from the source electrode to the drain electrode. It should be noted that the source and drain electrodes of the MOSFET are not fixed. For example, the source electrode and the drain electrode of the MOSFET may be exchanged based on an applied voltage thereto. Although each of the transistors constituting the AAGIP unit and the pixel circuit is embodied as the P-type TFT in the following embodiment, the present disclosure is not limited thereto. Therefore, the disclosure should not be limited due to the source and the drain of the TFT in the following description.

The compensation circuit may be configured such that the first switching element T1 may be connected to and disposed between the gate electrode and the second electrode of the driving element DT, and data voltage Vdata may be applied to the first electrode of the driving element DT through the second switching element T2. The compensation circuit may be configured such that driving voltage VDD may be applied to the driving element DT through the third switching element T3, and the driving voltage VDD may be applied to the storage capacitor Cst through the seventh switching element T7. The compensation circuit may be configured such that reference voltage Vref may be applied to the storage capacitor Cst through the eighth switching element T8 and the ninth switching element T9, and the initialization voltage *Vini* may be applied to the light-emitting element OLED through the sixth switching element T6.

In this regard, each of the first to ninth switching elements T1 to T9 and the driving element DT may be embodied as a thin-film transistor.

The first switching element T1 may be configured such that one of the first and second electrodes thereof is connected to the gate electrode of the driving element DT (N2), the other thereof is connected to the second electrode of the driving element DT (N3), and the gate electrode thereof is connected to the n scan line Scan n. In this regard, the first electrode may be a source electrode, and the second electrode may be a drain electrode. However, the present disclosure is not limited thereto. The first electrode may be a drain electrode, and the second electrode may be a source electrode.

The second switching element T2 may be configured such that one of the first and second electrodes is connected to the data voltage Vdata (N1'), the other thereof is connected to the first electrode of the driving element DT (N1), and the gate electrode thereof is connected to the n scan line Scan n. In this regard, the first electrode may be a source electrode, and the second electrode may be a drain electrode. However, the present disclosure is not limited thereto. The first electrode may be a drain electrode, and the second electrode may be a source electrode.

The third switching element T3 may be configured such that one of the first and second electrodes is connected to the first electrode of the driving element DT (N1), the other thereof is connected to a driving voltage line VDD (N7), and the gate electrode thereof is connected to an n-th light-emission control line EM(n). In this regard, the first electrode may be a source electrode, and the second electrode may be a drain electrode. However, the present disclosure is not limited thereto. The first electrode may be a drain electrode, and the second electrode may be a source electrode.

The fourth switching element T4 may be configured such that one of the first electrode and the second electrode is connected to the first electrode of the light-emitting element OLED (N4), the other thereof is connected to the second electrode of the driving element DT (N3), and the gate electrode thereof is connected to the n-th light-emission control line EM(n). In this regard, the first electrode may be a source electrode, and the second electrode may be a drain electrode. However, the present disclosure is not limited thereto. The first electrode may be a drain electrode, and the second electrode may be a source electrode.

The sixth switching element T6 may be configured such that one of the first electrode and the second electrode is connected to the initialization voltage line Vini (N6'), the other thereof is connected to the first electrode of the light-emitting element OLED (N4), and the gate electrode thereof is connected to the n scan line Scan n. In this regard, the first electrode may be a source electrode, and the second electrode may be a drain electrode. However, the present disclosure is not limited thereto. The first electrode may be a drain electrode, and the second electrode may be a source electrode.

The fifth switching element T5 may be configured such that one of the first electrode and the second electrode is connected to a connection point between the driving element DT and the storage capacitor Cst (N5), the other thereof is connected to a connection point between the sixth switching element T6 and the initialization voltage line Vini (N6), and the gate electrode thereof is connected to an (n−1)-th scan line Scan n−1. In this regard, the first electrode may be a source electrode, and the second electrode may be a drain electrode. However, the present disclosure is not limited thereto. The first electrode may be a drain electrode, and the second electrode may be a source electrode.

The seventh switching element T7 may be configured such that one of the first and second electrodes is connected to the driving voltage line VDD (N7), the other thereof is connected to the first electrode of the storage capacitor Cst (STR), and the gate electrode thereof is connected to the n-th light-emission control line EM(n). In this regard, the first electrode may be a source electrode, and the second electrode may be a drain electrode. However, the present disclosure is not limited thereto. The first electrode may be a drain electrode, and the second electrode may be a source electrode.

The eighth switching element T8 may be configured such that one of the first and second electrodes is connected to the reference voltage line Vref (N8'), the other thereof is connected to the first electrode of the storage capacitor Cst (N8), and the gate electrode thereof is connected to the (n−1)-th scan line Scan n−1. In this regard, the first electrode may be a source electrode, and the second electrode may be a drain electrode. However, the present disclosure is not limited thereto. The first electrode may be a drain electrode, and the second electrode may be a source electrode.

The ninth switching element T9 may be configured such that one of the first and second electrodes is connected to the reference voltage line Vref (N9), the other thereof is connected to the first electrode of the storage capacitor Cst (N8), and the gate electrode thereof is connected to the n-th scan line Scan n. In this regard, the first electrode may be a source electrode, and the second electrode may be a drain electrode. However, the present disclosure is not limited thereto. The first electrode may be a drain electrode, and the second electrode may be a source electrode.

In one example, the compensation circuit may be configured such that as for the first to fourth switching elements T1 to T4, the first switching element T1 may be connected to and disposed between the gate electrode and the second electrode of the driving element, the second switching element T2 may be connected to and disposed between the first electrode of the driving element and the data voltage line Vdata, the third switching element T3 may be connected to and disposed between the first electrode of the driving element and the driving voltage line VDD, and the fourth switching element T4 may be connected to and disposed between the first electrode of the light-emitting element and the second electrode of the driving element.

Further, the compensation circuit may be configured such that as for the sixth to eighth switching elements T6 to T8, the sixth switching element T6 may be connected to and disposed between the first electrode of the light-emitting element and the initialization voltage line Vini, the seventh switching element T7 may be connected to and disposed between the storage capacitor Cst and the driving voltage line VDD, and the eighth switching element T8 and the ninth switching element T9 may be connected to and disposed between the storage capacitor Cst and the reference voltage line Vref.

The first switching element T1, the second switching element T2, the sixth switching element T6, and the ninth switching element T9 may be switched based on the n-th scan signal Scan n.

The third switching element T3, the fourth switching element T4, and the seventh switching element T7 may be switched based on the n-th light-emission control signal EM(n).

The fifth switching element T5 and the eighth switching element T8 may be switched based on the (n−1)-th scan signal Scan n−1.

An operation period of the display panel 100 according to an embodiment of the present disclosure may be divided into an initialization period Initial, a sampling period Sampling, and a light-emission period Emission.

In this regard, the sampling period Sampling may be referred to as sensing and initialization period Sensing & Initial, and in some cases, may be referred to as 'programming period.'

Further, the operation period of the display panel 100 may include a holding period between the sampling period sampling and the light-emission period emission.

The initialization period Initial may be set to be equal to or shorter than 1 horizontal period (1H).

An (n−1)-th scan signal Scan n−1 may be a high signal for the initialization period, and may be a low signal for 1H for the sampling period, and may be a high signal for the light-emitting period.

An n-th scan signal Scan n may be a low signal for the initialization period, and may be a low signal for 2H for the sampling period, and may be a high signal for the light-emitting period.

An (n−1)-th light-emission control signal EM(n−1) may be a high signal for the initialization period and the sampling period, and may be a high signal for the light-emission period and the remaining period.

An n-th light-emission control signal EM(n) may be a high signal for a portion of each of the sampling period and light-emitting period, and may be a low signal in the remaining portion thereof.

The data voltage signal Vdata applied to the source electrode of the driving element DT may be a low signal for 1H for the sampling period and may be a high signal for the remaining period.

The data voltage signal applied to the gate electrode of the driving element DT may be a low signal for the initialization period 1H, and may increase from a low signal to a (Vdata-Vth) signal for the sampling period, and may be a high signal for the light-emitting period.

The reference voltage signal Vref applied to the contact node STR of the storage capacitor Cst may be a low signal for the initialization period and the sampling period, and may be a high signal for the light-emitting period.

For the light-emission period emission, a potential of the gate electrode of the driving element DT may be set to (VDD−Vref)+(Vdata+Vref).

Thus, a voltage difference Vgs between the voltages of the gate electrode and the source electrode of the driving element DT capable of compensating for the change in the threshold voltage Vth of the driving element DT may be set. Driving current Ioled corresponding to the gate-source voltage Vgs as shown in Equation 1 below may flow through the driving element DT.

Due to this driving current Ioled, the potential of each of the nodes N3 and N4 may rise to an operating point voltage Voled of the light-emitting diode OLED, and thus the light-emitting diode OLED may be turned on. As a result, the light-emitting diode OLED may emit light based on the driving current Ioled.

$$Ioled = K(Vgs - |Vth|)^2 \quad \text{Equation 1}$$
$$= K(EVDD - \{EVDD - |Vth| - Vdata + Vref\} - |Vth|)^2$$
$$= K(Vdata - Vref)^2$$

where K denotes a constant value determined based on mobility, a channel ratio, parasitic capacitance, etc., of the driving element DT and Vth refers to the threshold voltage of the driving element DT.

As may be identified from Equation 1, the driving current Ioled of the light-emitting diode OLED is not affected by the high-potential voltage power VDD as the driving voltage as well as by the threshold voltage Vth of the driving element DT.

In accordance with the present disclosure, when scan signals used for pixel initialization and threshold voltage sensing operations are supplied to neighboring display lines such that the scan signals applied to the neighboring display lines overlap each other for a predefined period, the AAGIP unit for generating the scan signals that overlap with each other may have a small number of clocks and a simple circuit configuration.

Figure 14:
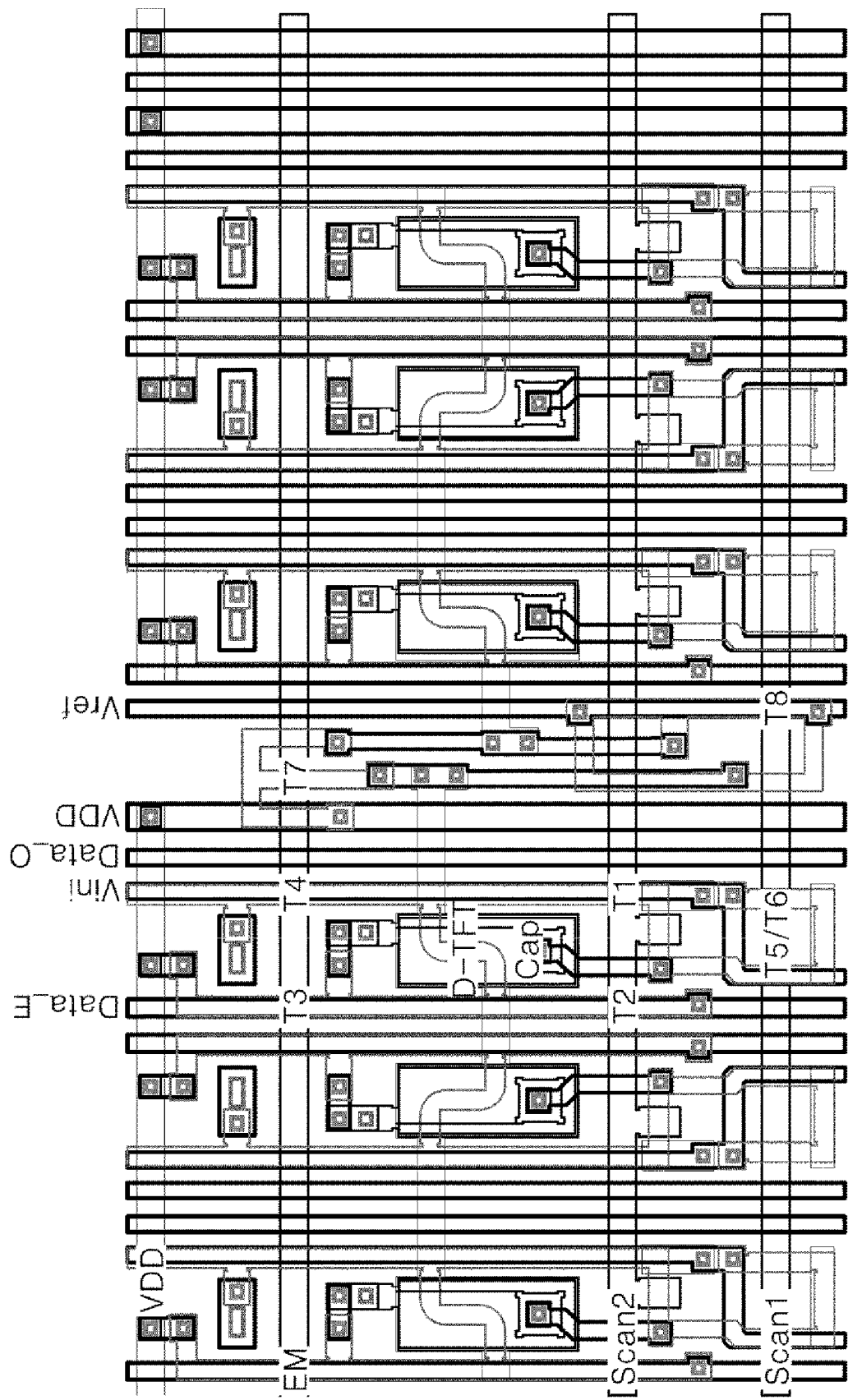
FIG. 14 is a diagram showing an example of an arrangement of transistors and lines for a circuit configuration of the sub-pixel shown in FIG. 13.

FIG. 14 is a diagram showing an example of an arrangement of the transistors and the lines for the circuit configuration of the sub-pixel shown in FIG. 13.

Referring to FIG. 14, it may be identified that, in a sub-pixel PX according to an embodiment of the present disclosure, each of one electrode of the third switching element T3 and one electrode of the seventh switching element T7 is connected to the driving voltage line VDD via a contact hole.

Further, it may be identified that, in the sub-pixel PX according to an embodiment of the present disclosure, each of one electrode of the third switching element T3, one electrode of the fourth switching element T4, and one electrode of the seventh switching element T7 is connected to the light-emitting line EM via a contact hole.

Further, it may be identified that, in the sub-pixel PX according to an embodiment of the present disclosure, each of one electrode of the fifth switching element T5 and one electrode of the eighth switching element T8 is connected to the first scan line Scan 1 via a contact hole.

Further, it may be identified that, in the sub-pixel PX according to an embodiment of the present disclosure, each of one electrode of the second switching element T2, one electrode of the sixth switching element T6, and one electrode of the ninth switching element T9 is connected to the second scan line Scan 2 via a contact hole.

Further, it may be identified that, in the sub-pixel PX according to an embodiment of the present disclosure, each of one electrode of the fifth switching element T5 and one electrode of the sixth switching element T6 is connected to the initialization voltage line Vini via a contact hole.

Further, it may be identified that, in the sub-pixel PX according to an embodiment of the present disclosure, each of one electrode of the eighth switching element T8 and one electrode of the ninth switching element T9 is connected to the reference voltage line Vref via a contact hole.

Further, it may be identified that, in the sub-pixel PX according to an embodiment of the present disclosure, the driving transistor DT is connected to the storage capacitor Cst as well as to the first switching element T1, the second switching element T2, the fourth switching element T4, and the fifth switching element T5.

As described above, according to the present disclosure, the AAGIP scheme display panel may be realized in which the AAGIP unit is disposed in the display area of the OLED display device, such that the defects such as the crosstalk or smear caused by the data signal transition or fluctuation of the data line may be reduced.

Moreover, according to the present disclosure, the OLED display device may be realized in which an individual operation of a horizontal scan line on a pixel block basis in a display area may reduce or minimize influence of the same data signal such as a crosstalk pattern.

All technical ideas and its equivalents discussed in the disclosure should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
a plurality of pixel blocks, each pixel block including a plurality of sub-pixels arranged in rows and columns; and
a plurality of Active Area Gate-In-Panel (AAGIP) units, each AAGIP unit being disposed between adjacent ones of the plurality of pixel blocks,
wherein an n scan line is disposed in and along sub-pixels of an n-th row in the pixel block on one side of one AAGIP unit, and an n+1 scan line is disposed in and along sub-pixels of an (n+1)-th row line of the pixel block on one side of the one AAGIP unit,
wherein an n+1 scan line is disposed in and along sub-pixels of an n-th row in a pixel block on the other side of the one AAGIP unit, and an n scan line is disposed in and along sub-pixels of an (n+1)-th row line of the pixel block on the other side of the one AAGIP unit,
wherein the one AAGIP unit is configured to:
couple the n scan line disposed in and along the sub-pixels of the n-th row of the pixel block on one side of the one AAGIP unit to the n scan line disposed in and along the sub-pixels of the (n+1)-th row of the pixel block on the other side of the one AAGIP unit; and
couple the n+1 scan line disposed in and along the sub-pixels of the (n+1)-th row of the pixel block on one side of the one AAGIP unit to the n+1 scan line disposed in and along the sub-pixels of the n-th row of the pixel block on the other side of the one AAGIP unit.

2. A display panel comprising:
a plurality of pixel blocks, each pixel block including a plurality of sub-pixels arranged in rows and columns; and
a plurality of Active Area Gate-In-Panel (AAGIP) units, each AAGIP unit being disposed between adjacent ones of the plurality of pixel blocks,
wherein an n scan line is disposed in and along sub-pixels of an n-th row in the pixel block on one side of one AAGIP unit, and an n+1 scan line is disposed in and along sub-pixels of an (n+1)-th row line of the pixel block on one side of the one AAGIP unit,
wherein an n scan line is disposed in and along sub-pixels of an n-th row in a pixel block on the other side of the one AAGIP unit, and an n+1 scan line is disposed in and along sub-pixels of an (n+1)-th row line of the pixel block on the other side of the one AAGIP unit,
wherein the one AAGIP unit is configured to:
apply an N scan signal to the n scan line disposed in and along the sub-pixels of the n-th row of the pixel block on one side of the one AAGIP unit and to the n+1 scan line disposed in and along the sub-pixels of the (n+1)-th row of the pixel block on the other side of the one AAGIP unit to each other; and
apply an N+1 scan signal to the n+1 scan line disposed in and along the sub-pixels of the (n+1)-th row of the pixel block on one side of the one AAGIP unit and to the n scan line disposed in and along the sub-pixels of the n-th row of the pixel block on the other side of the one AAGIP unit to each other.

3. The display panel of claim 1, wherein the one AAGIP unit is configured to:
apply an N scan signal to the n scan line of the pixel block on the one side of the one AAGIP unit and to the n scan line of the pixel block on the other side of the one AAGIP unit; and
apply an N+1 scan signal to the n+1 scan line of the pixel block on the one side of the one AAGIP unit and to the n+1 scan line of the pixel block on the other side of the one AAGIP unit.

4. The display panel of claim 2, wherein the one AAGIP unit is configured to respectively apply AAGIP control signals having different timings to the pixel block on the one side of the one AAGIP unit and the pixel block on the other side of the one AAGIP unit.

5. The display panel of claim 4, wherein when the N scan signal is a high level pulse signal, and the N+1 scan signal is a low level pulse signal.

6. The display panel of claim 4, wherein when the N scan signal is a low level pulse signal, and the N+1 scan signal is a high level pulse signal.

7. The display panel of claim 1, wherein each of the plurality of pixel blocks includes a unit pixel area composed of at least one sub-pixel selected from among red (R), green (G), blue (B), and white (W) sub-pixels.

8. The display panel of claim 7, wherein a driving element is disposed in each of the at least one sub-pixel.

9. The display panel of claim 1, wherein the one AAGIP unit includes an AAGIP TFT and an AAGIP capacitor.

10. A display device comprising:
a display panel including:
a plurality of pixel blocks, each pixel block including a plurality of sub-pixels arranged in rows and columns;
a plurality of data lines, each data line being disposed in each of columns of the plurality of sub-pixels; and
a plurality of Active Area Gate-In-Panel (AAGIP) units, each being disposed between adjacent ones of the plurality of pixel blocks,
wherein an n scan line is disposed in and along sub-pixels of an n-th row in the pixel block on one side of one AAGIP unit, and an n+1 scan line is disposed in and along sub-pixels of an (n+1)-th row line of the pixel block on one side of the one AAGIP unit,
wherein an n+1 scan line is disposed in and along sub-pixels of an n-th row in a pixel block on the other side of the one AAGIP unit, and an n scan line is disposed in and along sub-pixels of an (n+1)-th row line of the pixel block on the other side of the one AAGIP unit,
wherein the one AAGIP unit is configured to:
couple the n scan line disposed in and along the sub-pixels of the n-th row of the pixel block on one side of the one AAGIP unit to the n scan line disposed in and along the sub-pixels of the (n+1)-th row of the pixel block on the other side of the one AAGIP unit; and
couple the n+1 scan line disposed in and along the sub-pixels of the (n+1)-th row of the pixel block on one side of the one AAGIP unit to the n+1 scan line disposed in and along the sub-pixels of the n-th row of the pixel block on the other side of the one AAGIP unit;
a data driver for applying a data signal to the plurality of data lines;
a power supply for applying high-potential voltage, low-potential voltage, reference voltage, and initialization voltage to the display panel; and
a timing controller for controlling the plurality of AAGIP units and the data driver.

11. The display device of claim 10, wherein the display panel further includes:
a driving element for controlling a current flowing through a light-emitting element;
a storage capacitor coupled to the driving element; and
a compensation circuit for compensating for change in a threshold voltage of the driving element,
wherein the compensation circuit includes first to ninth switching elements, and is configured to cause:
the first switching element to be coupled to and disposed between a gate electrode and a second electrode of the driving element;
data voltage to be applied to a first electrode of the driving element through the second switching element;
driving voltage to be applied to the driving element through the third switching element;
the driving voltage to be applied to the storage capacitor through the seventh switching element;
reference voltage to be applied to the storage capacitor through the eighth switching element and the ninth switching element;
initialization voltage to be applied to the storage capacitor through the fifth switching element; and
the initialization voltage to be applied to the light-emitting element through the sixth switching element.

12. The display device of claim 11, wherein the compensation circuit is further configured to cause:
the first switching element to be coupled to and disposed between the gate electrode and the second electrode of the driving element;
the second switching element to be coupled to and disposed between a first electrode of the driving element and a data voltage line;
the third switching element to be coupled to and disposed between the first electrode of the driving element and a driving voltage line;
the fourth switching element to be coupled to and disposed between a first electrode of the light-emitting element and the second electrode of the driving element;
the sixth switching element to be coupled to and disposed between the first electrode of the light-emitting element and an initialization voltage line;
the fifth switching element to be coupled to and disposed between the sixth switching element and the storage capacitor;
the seventh switching element to be coupled to and disposed between the storage capacitor and the driving voltage line; and
the eighth switching element and the ninth switching element to be coupled to and disposed between the storage capacitor and a reference voltage line.

13. The display device of claim 10, wherein an operation period of the display panel is divided into an initialization period, a sampling period, and a light-emission period.

14. A display device comprising:
a display panel including:
a plurality of pixel blocks, each pixel block including a plurality of sub-pixels arranged in rows and columns;
a plurality of data lines, each data line being disposed in each of columns of the plurality of sub-pixels; and
a plurality of Active Area Gate-In-Panel (AAGIP) units, each AAGIP unit being disposed between adjacent ones of the plurality of pixel blocks,
wherein an n scan line is disposed in and along sub-pixels of an n-th row in the pixel block on one side of one AAGIP unit, and an n+1 scan line is disposed in and along sub-pixels of an (n+1)-th row line of the pixel block on one side of the one AAGIP unit,
wherein an n scan line is disposed in and along sub-pixels of an n-th row in a pixel block on the other side of the one AAGIP unit, and an n+1 scan line is disposed in and along sub-pixels of an (n+1)-th row line of the pixel block on the other side of the one AAGIP unit,
wherein the one AAGIP unit is configured to:
apply an N scan signal to the n scan line disposed in and along the sub-pixels of the n-th row of the pixel block on one side of the one AAGIP unit and to the n+1 scan line disposed in and along the sub-pixels of the (n+1)-th row of the pixel block on the other side of the one AAGIP unit to each other; and
apply an N+1 scan signal to the n+1 scan line disposed in and along the sub-pixels of the (n+1)-th row of the pixel block on one side of the one AAGIP unit and to the n scan line disposed in and along the sub-pixels of the n-th row of the pixel block on the other side of the one AAGIP unit to each other;
a data driver for applying a data signal to the plurality of data lines;
a power supply for applying high-potential voltage, low-potential voltage, reference voltage, and initialization voltage to the display panel; and
a timing controller for controlling the plurality of AAGIP units and the data driver.

15. The display device of claim 14, wherein at least one AAGIP unit among the plurality of AAGIP units includes a plurality of stages disposed in a distributed manner in the pixel blocks operating respectively based on the scan lines in the display panel, wherein each of the plurality of stages applies a scan pulse to a corresponding one of the scan lines.

\* \* \* \* \*